US011443091B1

(12) United States Patent
McColgan et al.

(10) Patent No.: US 11,443,091 B1
(45) Date of Patent: *Sep. 13, 2022

(54) DATA PROCESSING ENGINES WITH CASCADE CONNECTED CORES

(71) Applicant: Xilinx, Inc., San Jose, CA (US)

(72) Inventors: Peter McColgan, Dublin (IE); Baris Ozgul, Dublin (IE); David Clarke, Dublin (IE); Tim Tuan, San Jose, CA (US); Juan J. Noguera Serra, San Jose, CA (US); Goran H. K. Bilski, Molndal (SE); Jan Langer, Chemnitz (DE); Sneha Bhalchandra Date, San Jose, CA (US); Stephan Munz, Dublin (IE); Jose Marques, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/945,006

(22) Filed: Jul. 31, 2020

(51) Int. Cl.
*G06F 30/343* (2020.01)
*G06F 9/30* (2018.01)
*G06F 30/398* (2020.01)
*G06F 30/33* (2020.01)

(52) U.S. Cl.
CPC ........ *G06F 30/343* (2020.01); *G06F 9/30098* (2013.01); *G06F 30/33* (2020.01); *G06F 30/398* (2020.01)

(58) Field of Classification Search
CPC .. G06F 30/343; G06F 9/30098; G06F 30/398; G06F 30/33
See application file for complete search history.

(56) References Cited

U.S. PATENT DOCUMENTS

| 3,776,137 A |   | 12/1973 | Abbott |
|---|---|---|---|
| 4,876,641 A |   | 10/1989 | Cowley |
| 5,347,513 A | * | 9/1994 | Abefelt ............... H04L 12/6402 370/381 |
| 6,091,263 A |   | 7/2000 | New et al. |
| 6,150,839 A |   | 11/2000 | New et al. |

(Continued)

FOREIGN PATENT DOCUMENTS

| WO | 2019195132 A1 | 10/2019 |
|---|---|---|
| WO | 2019195309 A1 | 10/2019 |
| WO | 2019195343 A1 | 10/2019 |

OTHER PUBLICATIONS

Mellanox, "BlueField Multicore System on Chip," copyright 2017, 4 pp., Mellanox Technologies, Sunnyvale, California, USA.

(Continued)

*Primary Examiner* — Nha T Nguyen
(74) *Attorney, Agent, or Firm* — Kevin T. Cuenot

(57) ABSTRACT

An integrated circuit includes a plurality of data processing engines (DPEs) DPEs. Each DPE may include a core configured to perform computations. A first DPE of the plurality of DPEs includes a first core coupled to an input cascade connection of the first core. The input cascade connection is directly coupled to a plurality of source cores of the plurality of DPEs. The input cascade connection includes a plurality of inputs, wherein each of the plurality of inputs is connected to a cascade output of a different one of the plurality of source cores. The input cascade connection is programmable to enable a selected one of the plurality of inputs.

20 Claims, 11 Drawing Sheets

(56) References Cited

U.S. PATENT DOCUMENTS

| | | |
|---|---|---|
| 6,204,687 B1 | 3/2001 | Schultz et al. |
| 6,462,579 B1 | 10/2002 | Camilleri et al. |
| 6,526,557 B1 | 2/2003 | Young et al. |
| 6,759,869 B1 | 7/2004 | Young et al. |
| 6,810,514 B1 | 10/2004 | Alfke et al. |
| 6,836,842 B1 | 12/2004 | Guccione et al. |
| 6,907,595 B2 | 6/2005 | Curd et al. |
| 7,024,651 B1 | 4/2006 | Camilleri et al. |
| 7,057,413 B1 | 6/2006 | Young et al. |
| 7,124,338 B1 | 10/2006 | Mark et al. |
| 7,224,184 B1 | 5/2007 | Levi et al. |
| 7,302,625 B1 | 11/2007 | Payakapan et al. |
| 7,394,288 B1 | 7/2008 | Agarwal |
| 7,477,072 B1 | 1/2009 | Kao et al. |
| 7,478,357 B1 | 1/2009 | Mason et al. |
| 7,482,836 B2 | 1/2009 | Levi et al. |
| 7,509,617 B1 | 3/2009 | Young et al. |
| 7,518,396 B1 | 4/2009 | Kondapalli et al. |
| 7,539,845 B1 | 5/2009 | Wentzlaff et al. |
| 7,546,572 B1 | 6/2009 | Ballagh et al. |
| 7,619,442 B1 | 11/2009 | Mason et al. |
| 7,640,527 B1 | 12/2009 | Dorairaj et al. |
| 7,724,815 B1 | 5/2010 | Raha et al. |
| 7,746,099 B1 | 6/2010 | Chan et al. |
| 8,045,546 B1 | 10/2011 | Bao et al. |
| 8,102,188 B1 | 1/2012 | Chan et al. |
| 8,250,342 B1 | 8/2012 | Kostamov et al. |
| 8,359,448 B1 | 1/2013 | Neuendorffer |
| 8,415,974 B1 | 4/2013 | Lysaght |
| 8,719,750 B1 | 5/2014 | Balzli, Jr. |
| 8,796,539 B2 | 8/2014 | Asaumi et al. |
| 8,928,351 B1 | 1/2015 | Konduru |
| 9,081,634 B1 | 7/2015 | Simkins et al. |
| 9,436,785 B1 | 9/2016 | Javre |
| 9,722,613 B1 | 8/2017 | Schultz et al. |
| 9,990,241 B2 | 6/2018 | Dobbs |
| 10,635,622 B2 | 4/2020 | Bilski et al. |
| 10,747,690 B2 * | 8/2020 | Bilski ............ G06F 13/4022 |
| 2008/0082759 A1 | 4/2008 | Pong |
| 2014/0006751 A1 | 1/2014 | Aliseychik et al. |
| 2014/0267334 A1 | 9/2014 | Duluk, Jr. |
| 2016/0011996 A1 | 1/2016 | Asaad et al. |
| 2017/0220499 A1 | 8/2017 | Gray |
| 2017/0315944 A1 * | 11/2017 | Mayer ............ G06F 13/404 |
| 2018/0012637 A1 | 1/2018 | Krishna |
| 2019/0155666 A1 | 5/2019 | Dobbs |
| 2019/0303033 A1 | 10/2019 | Noguera Serra et al. |
| 2019/0303311 A1 | 10/2019 | Bilski et al. |
| 2019/0303328 A1 | 10/2019 | Bilski et al. |
| 2020/0380347 A1 * | 12/2020 | Marukame ............ G06N 3/063 |

OTHER PUBLICATIONS

Mellanox, "NP-5 Network Processor," copyright 2017, 2 pp., Mellanox Technologies, Sunnyvale, California, USA.

Mellanox, "Tile-Gx672 Processor," PB041, Feb. 14, 2015, 2 pp., Mellanox Technologies, Sunnyvale, California, USA.

Kalray, "Kalray NVMe-oF Target Controller Solutions," Dec. 18, 2017, 14 pp., Kalray Inc., Los Altos, California, USA.

EZchip, "Tile-Gx72 Processor," PB041, Feb. 14, 2015, 2 pp., EZchip Semiconductor, Inc., San Jose, California, USA.

Schooler, Richard, "Tile Processors: Many-Core for Embedded and Cloud Computing," Sep. 15, 2010, 35 pp., 14th Annual Workshop on High Performance Embedded Computing (HPEC '10).

Doud, B., "Accelerating the Data Plane With the Tile-MX Manycore Processor," Feb. 25, 2015, 19 pp., Linley Data Center Conference, EZChip Semiconductor, Inc., San Jose, California, USA.

Wentzlaff, David, et al., "On-Chip Interconnection Architecture of the Tile Processor," IEEE Micro, Nov. 12, 2007, pp. 15-31, vol. 27, Issue 5, IEEE Computer Society Press, Los Alamitos, California, USA.

Kalray, "MPPA Processors for Autonomous Driving," May 25, 2017, 18 pp., Kalray Inc., Los Altos, California, USA.

Xilinx, "UltraScale Architecture DSP Slice," UG579, Oct. 18, 2017, 74 pp., Xilinx, Inc., San Jose, California, USA.

Xilinx, Inc., "AXI4-Stream Interrnconnect v1.1, LogiCORE IP Product Guide," PG035, Vivado Design Suite,Chap. 2: Product Specification, Chap. 3: Designing With the Core, Oct. 4, 2017, 44 pg., Xilinx, Inc., San Jose, California, USA.

LogiCORE IP AXI Interconnect (v1.06.a), Product Specification, DS768, Dec. 18, 2012, 62 pg., Xilinx, Inc., San Jose, California.

* cited by examiner

DATA PROCESSING ENGINES WITH CASCADE CONNECTED CORES

TECHNICAL FIELD

This disclosure relates to integrated circuits (ICs) and, more particularly, to an IC having a plurality of data processing engines having cascade connected cores.

BACKGROUND

Integrated circuits (ICs) can be implemented to perform a variety of functions. Some ICs, referred to generally as programmable ICs, include programmable circuitry that can be programmed to perform specified functions. The programmable circuitry may be arranged in a grid of programmable tiles. An example of programmable circuitry includes programmable logic as may be included in a field programmable gate array. A circuit design may be realized in the programmable circuitry of such an IC by loading configuration data into configuration memory of the IC. The collective states of the individual configuration memory cells determine the functionality of the IC. For example, the particular operations performed by the various programmable tiles and the connectivity between the programmable tiles of the IC are defined by the collective states of the configuration memory cells once loaded with the configuration data.

Other types of programmable ICs have an embedded processor that is capable of executing program code. Such ICs may include a single processor, e.g., a central processing unit, that is capable of executing a user application. Other ICs may include a plurality of such processors that are capable of executing user applications and operating concurrently.

SUMMARY

In one or more example implementations, an integrated circuit (IC) includes a plurality of data processing engines (DPEs) DPEs. Each DPE may include a core configured to perform computations. A first DPE of the plurality of DPEs includes a first core coupled to an input cascade connection of the first core. The input cascade connection is directly coupled to a plurality of source cores of the plurality of DPEs. The input cascade connection includes a plurality of inputs, wherein each of the plurality of inputs is connected to a cascade output of a different one of the plurality of source cores. The input cascade connection is programmable to enable a selected one of the plurality of inputs.

In one or more example implementations, a method includes providing a plurality of DPEs each including a core configured to perform computations and providing a first DPE of the plurality of DPEs having a first core coupled to an input cascade connection of the first core. The input cascade connection is directly coupled to a plurality of source cores of the plurality of DPEs. The input cascade connection includes a plurality of inputs, wherein each of the plurality of inputs is connected to a cascade output of a different one of the plurality of source cores. The method can include programming the input cascade connection to enable a selected one of the plurality of inputs.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
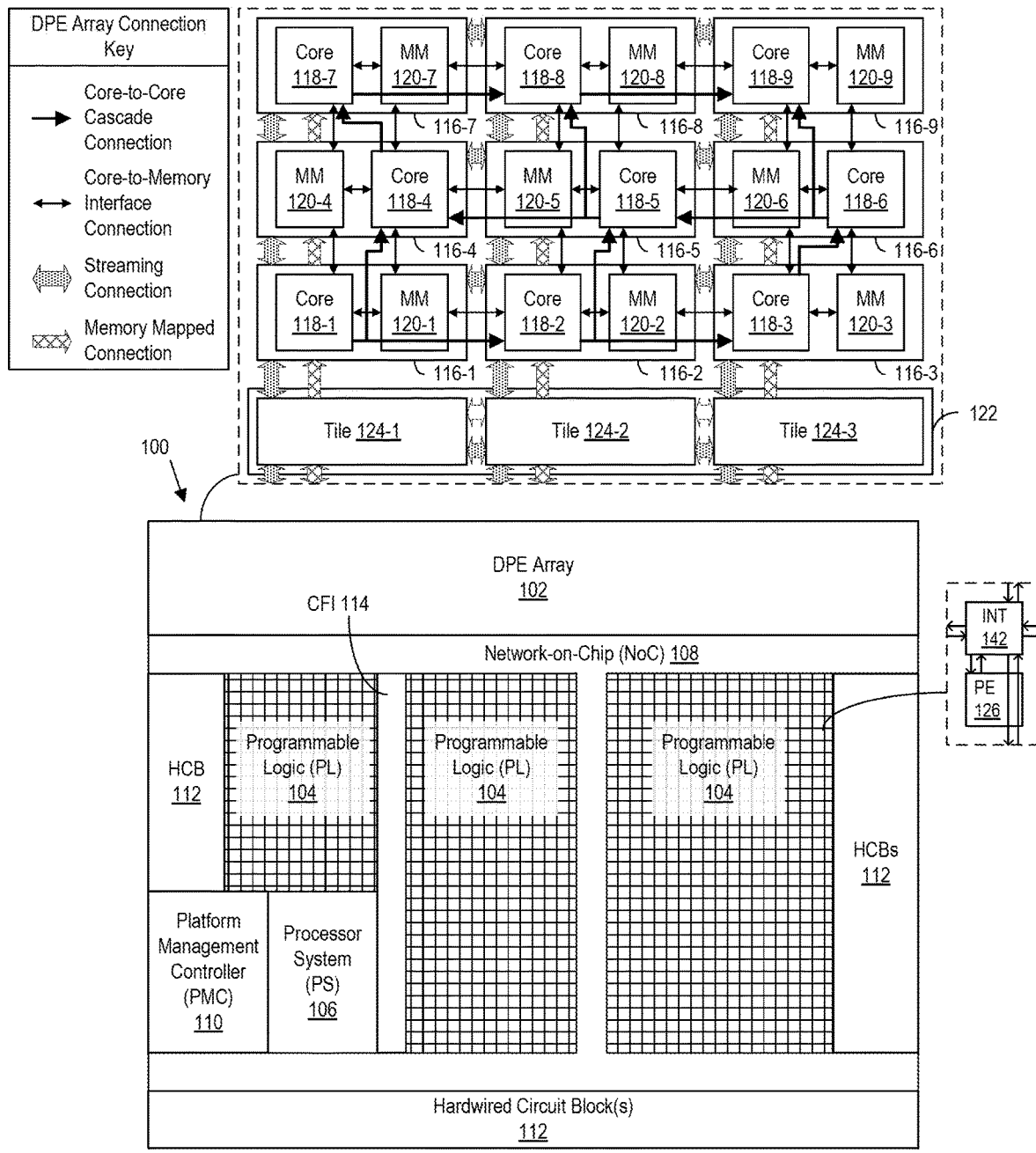
FIG. 1 illustrates an example architecture for an IC.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to an IC having a plurality of data processing engines (DPEs) having cascade connected cores. The plurality of DPEs may be arranged in a grid and referred to as a DPE array. In general, each DPE includes a core and a memory module. In some cases, the core is capable of executing computer readable instructions or program code. The memory module is a memory capable of storing data.

The DPEs are capable of communicating with one another through a variety of different mechanisms. In one aspect, the DPEs are capable of communicating with one another via a shared memory architecture where cores are capable of accessing the memory module in the same DPE and one or more other memory modules located in different DPEs. In another aspect, DPEs are capable of communicating with one another via stream switches capable of conveying data streams among the DPEs.

In still another aspect, the cores of the DPE array may be connected by cascade connections. For purposes of discussion, a "source core" refers to a core of a DPE that is sending data out to a core of another DPE via a cascade connection.

A "target core" refers to a core of a DPE that is receiving data via a cascade connection from a core of another DPE (e.g., from a source core). The terms "source" and "target" may also be used to refer to the particular DPE that includes the source core or target core as the case may be. In general, a cascade connection facilitates a source core sending contents of an internal register of the source core directly to a target core. In accordance with the inventive arrangements described within this disclosure, a source core is configurable to send data via the cascade connection to a selected target core of a plurality of different such target cores. Similarly, a given target core is configurable to receive data via a cascade connection from a selected source core of a plurality of such source cores.

The ability to send data via cascade connections to multiple different target cores and for a target core to receive data from multiple different source cores provides extended flexibility in the DPE array. More cores and different combinations of cores are capable of communicating directly than would otherwise be the case. This allows user designs implemented in the DPE array to form varied clusters of DPEs that may utilize the cascade connections with fewer restrictions relating to the placement and/or location of user program code (e.g., kernels) into the DPEs within the DPE array. Further, the increased number of cascade connections facilitates faster inter-DPE communication. In addition, data from a source DPE may be provided to two different target DPEs concurrently (e.g., broadcast) via the cascade connections.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example architecture for an IC (e.g., a device) 100. IC 100 is an example of a programmable IC and an adaptive system. In one aspect, IC 100 is also an example of a System-on-Chip (SoC). In the example of FIG. 1, IC 100 is implemented on a single die provided within a single integrated package. In other examples, IC 100 may be implemented using a plurality of interconnected dies where the various programmable circuit resources illustrated in FIG. 1 are implemented across the different interconnected dies that may be included in a single integrated package.

In the example, IC 100 includes a data processing engine (DPE) array 102, programmable logic (PL) 104, a processor system (PS) 106, a Network-on-Chip (NoC) 108, a platform management controller (PMC) 110, and one or more hardwired circuit blocks (HCBs) 112. A configuration frame interface (CFI) 114 is also included.

DPE array 102 is implemented as a plurality of interconnected and programmable DPEs 116. DPEs 116 may be arranged in an array and are hardwired. Each DPE 116 can include one or more cores 118 and a memory module (abbreviated "MM" in FIG. 1) 120. In one aspect, each core 118 is capable of executing program code stored in a core-specific program memory contained within each respective core (not shown). Each core 118 is capable of directly accessing the memory module 120 within the same DPE 116 and the memory module 120 of any other DPE 116 that is adjacent to the core 118 of the DPE 116 in the up, down, left, and right directions. For example, core 118-5 is capable of directly reading and/or writing (e.g., via respective memory interfaces not shown) memory modules 120-5, 120-8, 120-6, and 120-2. Core 118-5 sees each of memory modules 120-5, 120-8, 120-6, and 120-2 as a unified region of addressable memory (e.g., as a part of the local memory accessible to core 118-5). This facilitates data sharing among different DPEs 116 in DPE array 102. In other examples, core 118-5 may be directly connected to memory modules 120 in other DPEs.

DPEs 116 are interconnected by programmable DPE interconnect circuitry. The programmable DPE interconnect circuitry may include one or more different and independent networks. For example, the programmable DPE interconnect circuitry may include a streaming network formed of streaming connections (shaded arrows) and a memory mapped network formed of memory mapped connections (cross-hatched arrows).

Loading configuration data into control registers of DPEs 116 by way of the memory mapped connections allows each DPE 116 and the components therein to be controlled independently. DPEs 116 may be enabled/disabled on a per-DPE basis. Each core 118, for example, may be configured to access the memory modules 120 as described or only a subset thereof to achieve isolation of a core 118 or a plurality of cores 118 operating as a cluster. Each streaming connection may be configured to establish logical connections between only selected ones of DPEs 116 to achieve isolation of a DPE 116 or a plurality of DPEs 116 operating as a cluster. Because each core 118 may be loaded with program code specific to that core 118, each DPE 116 is capable of implementing one or more different kernels therein.

In other aspects, the programmable DPE interconnect circuitry within DPE array 102 may include additional independent networks such as a debug network and an event broadcast network, each being independent of one another and independent (e.g., distinct and separate from) the streaming connections and the memory mapped connections. In some aspects, the debug network is formed of memory mapped connections and/or is part of the memory mapped network.

Cores 118 may be directly connected with one or more adjacent cores 118 via cascade connections. In one aspect, cascade connections are unidirectional and direct connections between cores 118. In general, cascade connections are direct core-to-core connections that allow one core 118 to share data directly with another core 118. For example, through a cascade connection, content stored in an internal register of a core 118-2, can be provided directly to core 118-3 or directly to core 118-5. Similarly, through a cascade connection, core 118-5 is capable of directly receiving content from the internal register of core 118-6 or content from the internal register of core 118-2.

In an example implementation, the core 118 that is sending the content (e.g., the source core) is capable of sending content directly from the internal register over the cascade connection. Similarly, the content may be received directly in the internal register of the receiving core (e.g., the target core). In an example implementation, the internal register may be an accumulation register of the cores or another internal register that may connect (e.g., directly) and/or feed the accumulation register. Each of the cascade connections may be independently, e.g., separately, enabled or disabled by loading configuration data into control registers of the respective DPEs 116.

The cascade connections shown in FIG. 1 are provided for purposes of illustration and not limitation. Other example architectures with varying connectivity of cascade connections are described within this disclosure with reference to the remaining Figures.

In an example implementation, DPEs 116 do not include cache memories. By omitting cache memories, DPE array 102 is capable of achieving predictable, e.g., deterministic, performance. Further, significant processing overhead is avoided since maintaining coherency among cache memories located in different DPEs 116 is not required. In a further example, cores 118 do not have input interrupts. Thus, cores 118 are capable of operating uninterrupted. Omitting input interrupts to cores 118 also allows DPE array 102 to achieve predictable, e.g., deterministic, performance.

SoC interface block 122 operates as an interface that connects DPEs 116 to other resources of IC 100. In the example of FIG. 1, SoC interface block 122 includes a plurality of interconnected tiles 124 organized in a row. In particular embodiments, different architectures may be used to implement tiles 124 within SoC interface block 122 where each different tile architecture supports communication with different resources of IC 100. Tiles 124 are connected so that data may be propagated from one tile to another bi-directionally. Each tile 124 is capable of operating as an interface for the column of DPEs 116 directly above.

Tiles 124 are connected to adjacent tiles, to DPEs 116 immediately above, and to circuitry below using the streaming connections and the memory mapped connections as shown. Tiles 124 may also include a debug network that connects to the debug network implemented in DPE array 102. Tiles 124 are capable of sending data from DPEs 116 to other elements of IC 100 such as PS 106, PL 104, and/or an one or more HCBs 112. Similarly, tiles 124 are capable of sending data from elements of IC 100 such as PS 106, PL 104, and/or one or more HCBs 112 to particular DPEs 116. Tile 124-1, for example, is capable of providing those portions of the data, whether application or configuration, addressed to DPEs 116 in the column above to such DPEs 116 while sending data addressed to DPEs 116 in other columns on to other tiles 124, e.g., 124-2 or 124-3, so that such tiles 124 may route the data addressed to DPEs 116 in their respective columns accordingly.

In one aspect, SoC interface block 122 includes two different types of tiles 124. A first type of tile 124 has an architecture configured to serve as an interface only between DPEs 116 and PL 104. A second type of tile 124 is has an architecture configured to serve as an interface between DPEs 116 and NoC 108 and also between DPEs 116 and PL 104. SoC interface block 122 may include a combination of tiles of the first and second types or tiles of only the second type.

PL 104 is circuitry that may be programmed to perform specified functions. As an example, PL 104 may be implemented as field programmable gate array type of circuitry. PL 104 can include an array of programmable circuit blocks. As defined herein, the term "programmable logic" means circuitry used to build reconfigurable digital circuits. Programmable logic is formed of many programmable circuit blocks sometimes referred to as "tiles" that provide basic functionality. The topology of PL 104 is highly configurable unlike hardwired circuitry. Each programmable circuit block of PL 104 typically includes a programmable element 126 (e.g., a functional element) and a programmable interconnect 142. The programmable interconnects 142 provide the highly configurable topology of PL 104. The programmable interconnects 142 may be configured on a per wire basis to provide connectivity among the programmable elements 126 of programmable circuit blocks of PL 104 and is configurable on a per-bit basis (e.g., where each wire conveys a single bit of information) unlike connectivity among DPEs 116, for example, which are capable of communicating by way of packetized data via the stream switches.

Examples of programmable circuit blocks of PL 104 include configurable logic blocks having look-up tables and registers. Unlike hardwired circuitry described below and sometimes referred to as hard blocks, these programmable circuit blocks have an undefined function at the time of manufacture. PL 104 may include other types of programmable circuit blocks that also provide basic and defined functionality with more limited programmability. Examples of these circuit blocks may include digital signal processing blocks (DSPs), phase lock loops (PLLs), and block random access memories (BRAMs) of varying size. These types of programmable circuit blocks, like others in PL 104, are numerous and intermingled with the other programmable circuit blocks of PL 104. These circuit blocks may also have an architecture that generally includes a programmable interconnect 142 and a programmable element 126 and, as such, are part of the highly configurable topology of PL 104.

Prior to use, PL 104, e.g., the programmable interconnect and the programmable elements, must be programmed or "configured" by loading data referred to as a configuration bitstream into internal configuration memory cells therein. The configuration memory cells, once loaded with a configuration bitstream, define how PL 104 is configured, e.g., the topology, and operates (e.g., particular functions performed). Within this disclosure, a "configuration bitstream" is not equivalent to program code executable by a processor or computer.

PS 106 is implemented as hardwired circuitry that is fabricated as part of IC 100. PS 106 may be implemented as, or include, any of a variety of different processor types each capable of executing program code. For example, PS 106 may be implemented as an individual processor, e.g., a single core capable of executing program code. In another example, PS 106 may be implemented as a multi-core processor. In still another example, PS 106 may include one or more cores, modules, co-processors, I/O interfaces, and/or other resources. PS 106 may be implemented using any of a variety of different types of architectures. Example architectures that may be used to implement PS 106 may include, but are not limited to, an ARM processor architecture, an x86 processor architecture, a graphics processing unit (GPU) architecture, a mobile processor architecture, a DSP architecture, combinations of the foregoing architectures, or other suitable architecture that is capable of executing computer-readable instructions or program code (e.g., user applications).

NoC 108 is a programmable interconnecting network for sharing data between endpoint circuits in IC 100. The endpoint circuits can be disposed in DPE array 102, PL 104, PS 106, and/or selected HCBs 112. NoC 108 can include high-speed data paths with dedicated switching. In an example, NoC 108 includes one or more horizontal paths, one or more vertical paths, or both horizontal and vertical path(s). The arrangement and number of regions shown in FIG. 1 is merely an example. NoC 108 is an example of the common infrastructure that is available within IC 100 to connect selected components and/or subsystems.

Within NoC 108, the nets that are to be routed through NoC 108 are unknown until a user circuit design is created for implementation within IC 100. NoC 108 may be programmed by loading configuration data into internal configuration registers that define how elements within NoC 108 such as switches and interfaces are configured and operate to pass data from switch to switch and among the NoC interfaces to connect the endpoint circuits, whether such endpoint circuits are PS 106 or particular elements in PS 106, HCBs 112, circuit blocks implemented in PL 104, and/or DPE(s) 116 or clusters thereof in DPE array 102. NoC 108 is fabricated as part of IC 100 (e.g., is hardwired) and, while not physically modifiable, may be programmed to establish connectivity between different master circuits and different slave circuits of a user circuit design. NoC 108, upon power-on, does not implement any data paths or routes therein. Once configured by PMC 110, however, NoC 108 implements data paths or routes between endpoint circuits.

PMC 110 is responsible for managing IC 100. PMC 110 is a subsystem within IC 100 that is capable of managing the other circuit resources across the entirety of IC 100. PMC 110 is capable of maintaining a safe and secure environment, booting IC 100, and managing IC 100 during normal operations. For example, PMC 110 is capable of providing unified and programmable control over power-up, boot/configuration, security, power management, safety monitoring, debugging, and/or error handling for the different circuit resources of IC 100 (e.g., DPE array 102, PL 104, PS 106, NoC 108, and/or HCB(s) 112). PMC 110 operates as a dedicated platform manager that decouples PS 106 and from PL 104. As such, PS 106 and PL 104 may be managed, configured, and/or powered on and/or off independently of one another.

In one aspect, PMC 110 is capable of operating as a Root-of-Trust for the entirety of IC 100. As an example, PMC 110 is responsible for authenticating and/or validating device images containing configuration data for any of the programmable resources of IC 100 that may be loaded into IC 100. PMC 110 further is capable of protecting IC 100 against tampering during operation. By operating as the Root-of-Trust for IC 100, PMC 110 is capable of monitoring operation of PL 104, PS 106, HCB(s) 112, and/or any other programmable circuit resources that may be included in IC 100. The Root-of-Trust capabilities, as performed by PMC 110, are distinct and separate from PS 106 and PL 104 and/or any operations performed by the PS 106 and/or PL 104.

PMC 110 may be implemented as a processor with dedicated resources. PMC 110 may include multiple redundant processors. The processors of PMC 110 are capable of executing firmware. Use of firmware supports configurability and segmentation of global features of IC 100 such as reset, clocking, and protection to provide flexibility in creating separate processing domains (which are distinct from "power domains" that may be subsystem-specific). Processing domains may involve a mixture or combination of one or more different programmable circuit resources of IC 100 (e.g., wherein the processing domains may include different combinations or devices from DPE array 102, PS 106, PL 104, NoC 108, and/or other HCB(s) 112).

HCBs 112 include special-purpose circuit blocks fabricated as part of IC 100. Though hardwired, HCBs 112 may be configured by loading configuration data into control registers to implement one or more different modes of operation. Examples of HCBs 112 may include input/output (I/O) blocks, transceivers for sending and receiving signals to circuits and/or systems external to IC 100, memory controllers, or the like. Examples of different I/O blocks may include single-ended and pseudo differential I/Os. Examples of transceivers may include high-speed differentially clocked transceivers. Other examples of HCBs 112 include, but are not limited to, cryptographic engines, digital-to-analog converters (DACs), analog-to-digital converters (ADCs), and the like. In general, HCBs 112 are application-specific circuit blocks.

CFI 114 is an interface through which configuration data, e.g., a configuration bitstream, may be provided to PL 104 to implement different user-specified circuits and/or circuitry therein. CFI 114 is coupled to and accessible by PMC 110 to provide configuration data to PL 104. In some cases, PMC 110 is capable of first configuring PS 106 such that PS 106, once configured by PMC 110, may provide configuration data to PL 104 via CFI 114. In one aspect, CFI 114 has a built in cyclic redundancy checking (CRC) circuitry (e.g., CRC 32-bit circuitry) incorporated therein. As such, any data that is loaded into CFI 114 and/or read back via CFI 114 may be checked for integrity by checking the values of codes attached to the data.

The various programmable circuit resources illustrated in FIG. 1 may be programmed initially as part of a boot process for IC 100. During runtime, the programmable circuit resources may be reconfigured. In one aspect, PMC 110 is capable of initially configuring DPE array 102, PL 104, PS 106, and NoC 108. At any point during runtime, PMC 110 may reconfigure all or a portion of IC 100. In some cases, PS 106 may configure and/or reconfigure PL 104 and/or NoC 108 once initially configured by PMC 110.

Figure 2A:
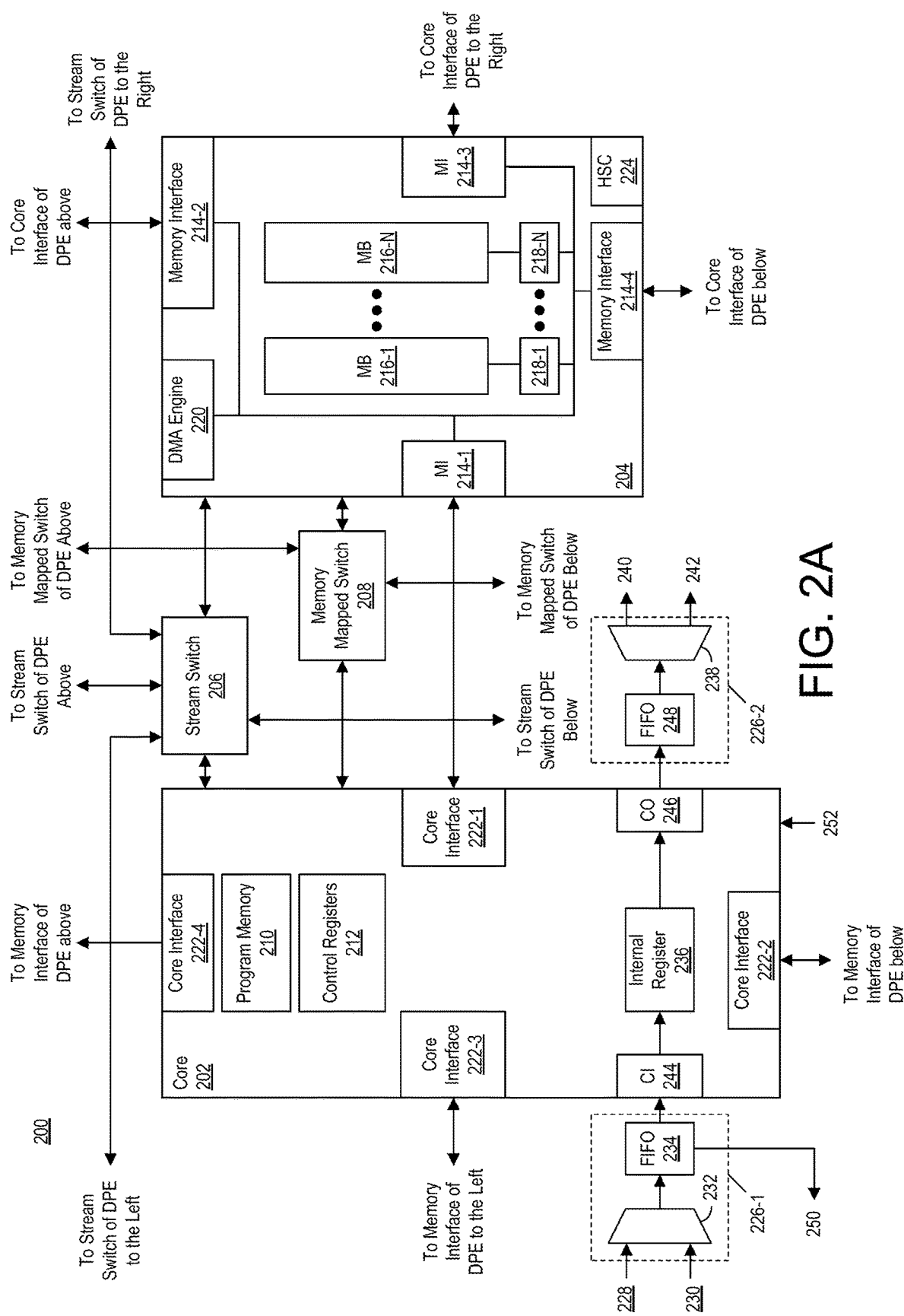
FIGS. 2A and 2B illustrate example architectures for a data processing engine (DPE).
Figure 2B:
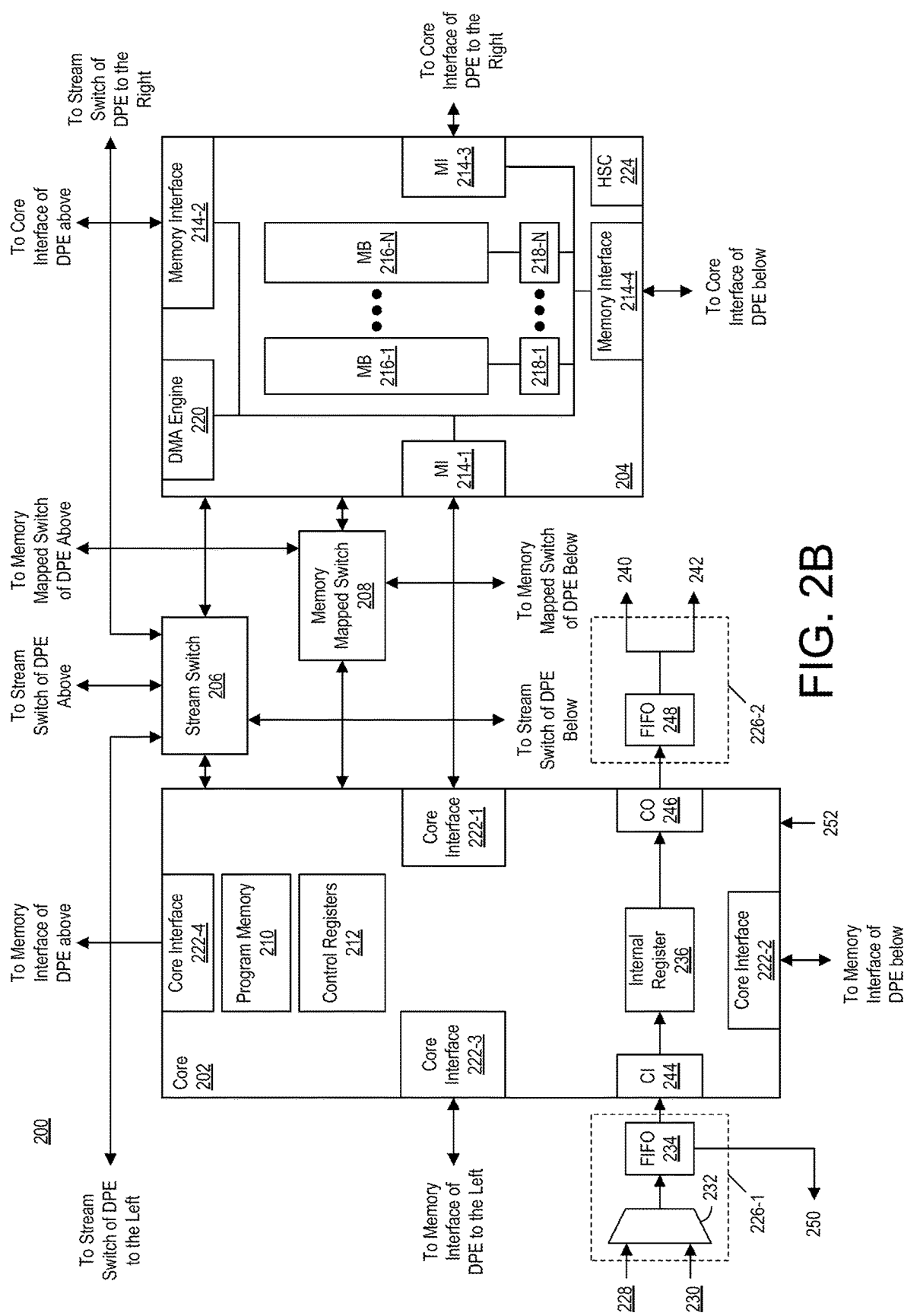

FIGS. 2A and 2B illustrate example architectures for a DPE 200. DPE 200 may be included in a DPE array such as DPE array 102 of FIG. 1. Referring to the example of FIG. 2A, DPE 200 includes a core 202 and a memory module 204. DPE 200 further includes a DPE interconnect that includes a stream switch 206 and a memory mapped switch 208.

Core 202 provides the data processing capabilities of DPE 200. Core 202 may be implemented as any of a variety of different processing circuits. In the example of FIG. 2A, core 202 includes an optional program memory 210. In one or more embodiments, core 202 is implemented as a processor that is capable of executing program code, e.g., computer readable instructions. Program memory 210 is capable of storing instructions that are executed by core 202. Core 202, for example, may be implemented as a CPU, a GPU, a DSP, a vector processor, or other type of processor that is capable of executing instructions. The core may be implemented using any of the various CPU and/or processor architectures described herein. In another example, core 202 is implemented as a very long instruction word (VLIW) vector processor or DSP.

In particular embodiments, program memory 210 is implemented as a dedicated program memory that is private to core 202. Program memory 210 may only be used by the core of the same DPE 200. Thus, program memory 210 may only be accessed by core 202 and is not shared with any other DPE or component of another DPE in the DPE array. Program memory 210 may include a single port for read and write operations and is addressable using the memory mapped network portion of the DPE array via memory mapped switch 208. Via the memory mapped switch 208, for example, program memory 210 may be loaded with program code by a master circuit external to the DPE array. The program code loaded into program memory 210 may be executed by core 202.

In one or more embodiments, core 202 may have a customized architecture to support an application-specific instruction set. For example, core 202 may be customized for wireless applications and be configured to execute wireless-specific instructions. In another example, core 202 may be customized for machine learning and be configured to execute machine learning-specific instructions.

In one or more other embodiments, core 202 is implemented as hardwired circuitry such as a hardened Intellectual Property (IP) core that is dedicated for performing a particular operation or operations. In that case, core 202 may not execute program code. In embodiments where core 202 does not execute program code, program memory 210 may be omitted. As an illustrative and non-limiting example, core 202 may be implemented as a hardened forward error correction (FEC) engine or other circuit block.

In some example implementations, different DPEs of the DPE array may include different types of cores 202. For example, one or more cores 202 may be implemented to execute program code while other DPEs are incapable of executing program code. In any case, each core is configured to perform computations whether through execution of program code/instructions or not, and may include an internal register or registers that may be used with the cascade connectivity described within this disclosure.

Core 202 may include control registers 212. Control registers 212 may be loaded with configuration data to control operation of DPE 200. For example, configuration data loaded into control registers 212 is capable of configuring and/or controlling operation of core 202, memory module 204, stream switch 206, and the cascade interfaces of DPE 200 to be described herein in greater detail. In one or more embodiments, DPE 200 may be activated and/or deactivated, e.g., as a whole, based upon configuration data loaded into control registers 212. Similarly, core 202 may be activated and/or deactivated based upon configuration data loaded into control registers 212. Core 202 may be activated and/or deactivated independently of memory module 204 so that memory module 204 may be accessed by one or more other cores. In the example of FIG. 2A, control registers 212 are addressable (e.g., may be read and/or written) via the memory mapped network through memory mapped switch 208.

In one or more embodiments, memory module 204 is capable of storing data that is used by and/or generated by core 202 (or another core of another DPE), which is referred to herein as application data. Memory module 204 may include a read/write memory such as a random-access memory. Accordingly, memory module 204 is capable of storing data that may be read and consumed by core 202. Memory module 204 is also capable of storing data (e.g., results) that are written by core 202.

In one or more other embodiments, memory module 204 is capable of storing data, e.g., application data, that may be used by and/or generated by one or more other cores of other DPEs within the DPE array. One or more other cores of DPEs may also read from and/or write to memory module 204. In particular embodiments, the other cores that may read from and/or write to memory module 204 may be cores of one or more neighboring DPEs. Another DPE that shares a border or boundary with DPE 200 (e.g., that is adjacent) is said to be a "neighboring" DPE relative to DPE 200. By allowing core 202 and one or more other cores from neighboring DPEs (e.g., DPEs above, below, to the left, and to the right of DPE 200) to read and/or write to memory module 204, memory module 204 implements a shared memory that supports communication among the different DPEs and/or cores capable of accessing memory module 204.

In one or more embodiments, the DPE interconnect circuitry for the DPE array includes two different networks. The first network is capable of exchanging data with other DPEs of the DPE array and/or other subsystems of IC 100. For example, the first network is capable of exchanging application data. The second network is capable of exchanging data such as configuration, control, and/or debugging data for the DPE(s).

In the example of FIG. 2A, the first network of the DPE interconnect is formed of stream switch 206 and one or more stream interfaces of other DPEs. As pictured, stream switch 206 is coupled to the stream switches of the DPEs to the left, right, above, and below DPE 200. In the case where DPE 200 is in the bottom row, stream switch 206 is coupled to a tile of SoC interface block 122.

Stream switch 206 is coupled to core 202 and is capable of communicating with core 202. Core 202, for example, includes a stream interface that connects to stream switch 206 thereby allowing core 202 to communicate directly with other DPEs 200 via the DPE interconnect circuitry. For example, core 202 may include instructions or hardwired circuitry that enable core 202 to send and/or receive data directly via stream switch 206.

Stream switch 206 is coupled to memory module 204 and is capable of communicating with memory module 204. Memory module 204, for example, includes a stream interface that connects to stream switch 206 thereby allowing other DPEs 200 to communicate with memory module 204 via the DPE interconnect circuitry. Stream switch 206 is capable of allowing non-neighboring DPEs and/or DPEs that are not coupled to a memory interface of memory module 204 to communicate with core 202 and/or memory module 204 via the DPE interconnect circuitry including the stream switches of the respective DPEs of the DPE array. As such, core 202 and/or memory module 204 are also capable of communicating with any of the DPEs within DPE array 102 via the DPE interconnects in the DPEs.

Stream switch 206 may also be used to interface to subsystems such as PL 104 and/or NoC 108. In general, stream switch 206 may be programmed to operate as a circuit-switching stream interconnect or a packet-switched stream interconnect. A circuit-switching stream interconnect is capable of implementing point-to-point, dedicated streams that are suitable for high-bandwidth communication among DPEs. A packet-switching stream interconnect allows streams to be shared to time-multiplex multiple logical streams onto one physical stream for medium bandwidth communication.

Stream switch 206 may be configured via control registers 212. The configuration data loaded into control registers 212, for example, dictates which other DPEs and/or subsystems (e.g., NoC 108, PL 104, and/or PS 106) DPE 200 will communicate with and whether such communications are established as circuit-switched point-to-point connections or as packet-switched connections.

The second network of the DPE interconnect is formed of memory mapped switch 208. Each component of DPE 200 that may be read and/or written, e.g., control registers 212, program memory 210, and memory module 204 may be read or written using mapped switch 208. Memory mapped switch 208 may also be used to exchange configuration, control, and debugging data for DPE 200. In the example of FIG. 2A, memory mapped switch 208 is capable of receiving configuration data that is used to configure DPE 200. Memory mapped switch 208 may receive configuration data from a memory mapped switch of a DPE located below of DPE 200 and/or from SoC interface block 122 (e.g., when DPE 200 is located in a bottom row of the DPE array). Memory mapped switch 208 is capable of forwarding received configuration data to one or more other DPEs above DPE 200, to core 202 (e.g., to program memory 210 and/or to control registers 212), and/or to memory module 204 (e.g., to memory within memory module 204). Thus, memory mapped switch 208 communicates with a memory mapped switch of a DPE or a tile of SoC interface block 122 below and/or with a memory mapped switch of a DPE above.

Taken collectively, the DPE interconnects of the various DPEs of a DPE array form a DPE interconnect network (which may include the stream network and/or the memory mapped network). The control registers of the respective DPEs may be programmed by loading configuration data through the memory mapped switches. Through configuration, the stream switches and/or stream interfaces are programmed to establish connections, whether packet-switched or circuit-switched, with other endpoints, whether in one or more other DPE and/or in SoC interface block 122.

For example, the DPE array may be mapped to the address space of a processor system such as PS 106 and/or PMC 110. Accordingly, any configuration registers and/or memories within a DPE of the DPE array may be accessed via a memory mapped interface. For example, memory in memory module 204, program memory 210, and/or control registers 212 may be read and/or written via memory mapped switches in the respective DPEs.

Memory mapped switch 208, in combination with memory mapped switches of other DPEs, implement a shared, transaction switched network where transactions propagate from memory mapped switch to memory mapped switch. Each of the memory mapped switches, for example, is capable of dynamically routing transactions based upon addresses. Memory mapped switch 208 allows other subsystems of IC 100 to access resources (e.g., components) of DPE 200.

In the example of FIG. 2A, memory module 204 includes a plurality of memory interfaces 214-1, 214-2, 214-3, and 214-4. Within FIG. 2A, memory interfaces 214-1 and 214-2 are abbreviated as "MI." Memory module 204 further includes a plurality of memory banks 216-1 to 216-N. In particular embodiments, memory module 204 includes eight memory banks. In other embodiments, memory module 204 may include fewer or more memory banks 216. In the example of FIG. 2A, each of memory banks 216-1 through 216-N has a respective arbiter 218-1 through 218-N. Each arbiter 218 may include arbitration logic. Further, each arbiter 218 may include a crossbar. Accordingly, any master is capable of writing to any particular one or more of memory banks 216.

Memory module 204 may include a memory mapped interface (not shown) that communicates with memory mapped switch 208. The memory mapped interface in memory module 204 may be connected to the communication lines in memory module 204 that couple to a direct memory access (DMA) engine 220, memory interfaces 214, and arbiters 218 in order to read and/or write to memory bank 216.

DMA engine 220 may include two or more interfaces. For example, one or more interfaces are capable of receiving input data streams from stream switches in other DPEs writing the received data to memory banks 216. One or more other interfaces are capable of reading data from memory banks 216 and sending the data out via a stream interface of DMA engine 220.

Memory module 204 is capable of operating as a shared memory that may be accessed by a plurality of different DPEs. In the example of FIG. 2A, memory interface 214-1 is coupled to core 202 via a core interface 222-1 included in core 202. Memory interface 214-1 provides core 202 with access (e.g., read and write capability) to memory banks 216 through arbiters 218. Memory interface 214-2 is coupled to a core interface of the DPE above DPE 200 in the DPE array. Memory interface 214-2 provides the core of the DPE above DPE 200 with access to memory banks 216. Memory interface 214-3 is coupled to a core interface of the DPE to the right of DPE 200 in the DPE array. Memory interface 214-3 provides the core of the DPE to the right of DPE 200 with access to memory banks 216. Memory interface 214-4 is coupled to a core interface of the DPE below DPE 200 in the DPE array. Memory interface 214-4 provides the core of the DPE below DPE 200 with access to memory banks 216.

Core 202 is capable of accessing memory modules of other neighboring DPEs via core interfaces 222-2, 222-3, and 222-4. In the example of FIG. 2A, core interface 222-2 is coupled to a memory interface of the DPE below DPE 200 of the DPE array. Accordingly, core 202 is capable of accessing the memory module of the DPE below DPE 200. Core interface 222-3 is coupled to a memory interface of the DPE to the left of DPE 200 of the DPE array. Accordingly, core 202 is capable of accessing the memory module of the DPE to the left of DPE 200. Core interface 222-4 is coupled to a memory interface of the DPE above DPE 200 of the DPE array. Accordingly, core 202 is capable of accessing the memory module of the DPE above DPE 200.

As noted, core 202 is capable of mapping read and/or write operations in the correct direction through core interfaces 222-1, 222-2, 222-3, and/or 222-4 based upon the addresses of such operations. When core 202 generates an address for a memory access, core 202 is capable of decoding the address to determine the direction (e.g., the particular DPE to be accessed) and forwards the memory operation to the correct core interface in the determined direction.

Memory module 204 may include hardware synchronization circuitry 224 (abbreviated as "HSC" in FIG. 2A). In general, hardware synchronization circuitry 224 is capable of synchronizing operation of different cores (e.g., cores of neighboring DPEs), core 202 of FIG. 2A, DMA engine 220, and other external masters (e.g., PS 106) that may communicate with a DPE such as DPE 200 via the DPE interconnect. As an illustrative and non-limiting example, HSC 224 is capable of synchronizing two different cores in different DPEs accessing the same, e.g., a shared, buffer in memory module 204. HSC 224 may be accessed by core 202 and/or cores of neighboring DPEs (e.g., those core of other DPEs connected to memory interfaces 214) and/or by the memory mapped switches of DPEs.

In addition to communicating with neighboring DPEs through shared memory modules and neighboring and/or non-neighboring DPEs via the DPE interconnect circuitry, core 202 may include one or more cascade interfaces such as a cascade input (depicted as "CI" in FIG. 2A) 244 and a cascade output (depicted as "CO" in FIG. 2A) 246. Cascade input 244 and cascade output 246 each may be connected to a cascade connection 226. In the example of FIG. 2A, cascade connections 226 are capable of providing direct communication with other cores of other DPEs by way of connecting to the cascade connections, cascade inputs, and/or cascade outputs of other DPEs in the DPE array.

In the example of FIG. 2A, cascade connection 226-1, which is considered an input cascade connection of DPE 200, is connected to cascade input 244. Cascade connection 226-1 includes a switch 232 and a first-in-first-out (FIFO) memory 234. Switch 232 has two inputs 228 and 230, each capable of receiving data. Each of input 228 and input 230 is coupled to a cascade output or an output cascade connection of a different core and, as such, a different DPE (e.g., two DPEs other than DPE 200). In other example implementations, switch 232 may include more than two inputs, where each is connected to a cascade output or a cascade connection of a different core and, as such a different DPE.

Cascade connection 226-1 is capable of operating in a plurality of different modes of operation. In one aspect, switch 232 receives a control signal (not shown) from control registers 212. The control signal selects the particular operating mode to be implemented by cascade connection 226-1.

In one example mode of operation, switch 232 is implemented as a multiplexer where switch 232 is capable of allowing data from one of the inputs to pass on to FIFO memory 234. For example, switch 232 may be placed in an operating mode that selects input 228 or input 230 to pass data received on the selected input to FIFO memory 234. Data received on the non-selected input is not passed thereby isolating the source core connected to the non-selected input of cascade connection 226-1. This allows the source core to directly share data with core 202. In another mode of operation, the selected and non-selected inputs are reversed. In still another mode of operation, switch 232 is configured to disable inputs 228 and 230 (e.g., all inputs if more than two) thereby preventing any data received on either input 228 or 230 to pass on to FIFO 234 or core 202. In this mode of operation, switch 232 effectively isolates core 202 from the source core coupled to input 228 and the source core coupled to input 230. In this mode of operation, cascade connection 226-1 is said to be deactivated or disabled.

FIFO memory 234 is connected to an internal register 236 of core 202. In one aspect, internal register 236 is an accumulation register of core 202. An accumulation register of core 202 is an internal register in which intermediate results of operations performed by core 202 may be stored. The accumulation register allows core 202 to store such intermediate results of calculations without having to write such content/data to another memory located external to core 202. In another aspect, internal register 236 is another register that is specifically included in cascade connection 226-1 that feeds the accumulation register.

In the example of FIG. 2A, cascade connection 226-2, which is considered an output cascade connection of core 202, is connected to cascade output 246. Cascade connection 226-2 includes a FIFO memory 248 and a switch 238. FIFO memory 248 receives content from internal register 236, e.g., the accumulation register or another internal register connected to the accumulation register. FIFO memory 248 outputs the received data to switch 238. Switch 238 is capable of outputting the data via output 240 or output 242. Each of output 240 and output 242 is coupled to a cascade input and/or an input cascade connection of a different core and, as such, a different DPE (e.g., two DPEs other than DPE 200 and DPEs other than the DPEs connected to cascade connection 226-1). In other example implementations, switch 238 may have more than two outputs where each output is coupled to a cascade input and/or an input cascade connection of a different core and, as such, a different DPE.

Cascade connection 226-2 is capable of operating in a plurality of different modes of operation. In one aspect, switch 238 receives a control signal (not shown) from control registers 212. The control signal selects the particular operating mode to be implemented by cascade connection 226-2.

In one example mode of operation, switch 238 is configured to send data from internal register 236 over a selected one of outputs 240 or 242 (or over a selected one of the more than two outputs) to a target core. The non-selected output(s) do not output data to the coupled target core and effectively isolate core 202 from the target core coupled to the non-selected output(s). This allows core 202 to directly share data with a target core. In another mode of operation, the selected and non-selected outputs are reversed. In still another mode of operation, switch 238 is configured to disable both outputs 240, 242 (e.g., all outputs when more than two) thereby preventing any data from being passed to target cores. In this mode of operation, switch 238 effectively isolates core 202 from the target core coupled to output 240 and the target core coupled to output 242. In this mode of operation, cascade connection 226-2 is said to be deactivated or disabled. In still another mode of operation, switch 238 is configured to send data from internal register 236 over both of outputs 240 and 242 to two different target cores concurrently or from two or more or all of the outputs concurrently when more than two outputs are included. In this example, the same data may be sent from internal register 236 via each of the selected outputs concurrently (e.g., broadcast).

In still another example implementation, each output of switch 238 may be independently programmable to pass data or not. This allows any combination of one or more or all of the outputs to be set to pass data to the connected cascade input or input cascade connection of the target core and/or be set to not pass data.

Each of cascade interfaces 244 and 246 and corresponding cascade connections 226-1 and 226-2 may be hundreds of bits in width. Still, the particular bit width is not intended as a limitation. Cascade output 246, e.g., the cascade output of each core of a DPE, is capable of outputting the contents of the internal register and may do so each clock cycle. Further, the particular DPEs to which inputs and outputs of the cascade input and cascade output are connected may vary. Example connectivity is illustrated within this disclosure in connection with FIGS. 3A, 3B, 5A, 5B, and 5C.

In one aspect, cascade interfaces 244, 246 may be programmed based upon configuration data loaded into control registers 212. For example, based upon control registers 212, cascade interface 244 and/or 246 may be activated or deactivated. Cascade interface 244 may be activated and/or deactivated independently of cascade interface 246.

In another aspect, cascade connections 226-1 and 226-2 may be programmed based upon configuration data loaded into control registers 212. For example, based upon control registers 212, cascade connection 226-1 and/or cascade connection 226-2 may be activated or deactivated. Cascade connection 226-1 may be activated and/or deactivated independently of cascade connection 226-2. It should be appreciated that cascade interfaces 244 and 246 and cascade connections 226-1 and 226-2 may be activated and/or deactivated by way of control registers 212.

Further, in one aspect, the particular operating mode of each cascade connection 226 may be set by control registers 212. For example, external masters such as PS 106 and/or PMC 110 are capable of writing to control registers 212 to control the operating mode of the cascade connections 226 and/or cascade interfaces. In another aspect, core 202 is capable of writing to control registers 212 using memory mapped switch 208 to control the operating mode of cascade interfaces 226 and/or the cascade interfaces. In a further example, core 202 may include instructions (e.g., program code) to read cascade interface 244 or to write to cascade interface 246 on particular clock cycles.

In one or more embodiments, the DPE array may be functionally isolated into a plurality groups, e.g., clusters, of one or more DPEs. For example, specific memory interfaces may be enabled and/or disabled via configuration data to create one or more clusters of DPEs, where each cluster includes one or more (e.g., a subset) of DPEs of the DPE array. In addition or in the alternative, the stream interfaces may be configured independently per cluster so as to communicate with (e.g., only with) other cores and/or memory modules of DPEs in the same cluster and/or with a designated input source and/or output destination. In addition or in the alternative, the cascade connections may be configured so that only cores in the same cluster are capable of communicating via the cascade connections. This effectively isolates clusters of DPEs so that different clusters are capable of executing different applications independently and in isolation.

It should be appreciated that DPEs may be organized into clusters whereby certain DPE(s) or all DPE(s) of one cluster may be connected to other DPEs in the same cluster through any combination of one or more or all of stream switches, shared memory, and/or cascade connections. In addition, certain DPE(s) of one cluster may be isolated from DPE(s) of another cluster in terms of not being able to communicate cross cluster using one or more of the stream switches, shared memory, and/or cascade connections, but permitted to communicate cross cluster using a subset of the stream switches, shared memory, and/or cascade connections.

In the example of FIG. 2A, a backpressure signal 250 is included that may be generated from FIFO memory 234. Backpressure signal 250 may indicate when FIFO memory 234 has space to receive new data or indicate an amount of space available in FIFO memory 234 to receive new data. Backpressure signal 250 may be provided to the core of source DPEs connected to core 202. For example, backpressure signal 250 may be provided to each of the DPEs coupled to inputs 228 and 230 and indicate whether core 202 is able to receive data via cascade connection 226-1. Similarly, core 202 may receive one or more backpressure signals 252 from other cores of DPEs (e.g., of target DPEs) coupled to outputs 240 and 242 indicating whether such cores are able to receive data via cascade connection 226-2. Core 202 may receive a backpressure signal 252 from each target core to which output cascade connection 226-2 is connected. Core 202 may discontinue sending data to the target cores via cascade output 246 in response to backpressure signal 252.

Signals 250 and 252 implement hand-shaking (e.g., flow control) between source and target cores using cascade connections. In the event that a target core is unable to accept data over a cascade connection, the target core may assert signal 250 to stop or stall the data transfer from the source core. A core receiving a backpressure signal may, in response to the received backpressure signal, pause or halt the sending of data via the cascade interface, at least to the particular target core from which the backpressure signal was received.

In another example implementation, core 202 may generate signal 250 (e.g., as opposed to FIFO memory 234). For example, core 202 may generate signal 250 based on whether core 202 is capable of receiving data (e.g., an internal operating state within core 202) and/or based on how much space is available in FIFO memory 234.

FIG. 2B illustrates another example architecture for DPE 200. The example of FIG. 2B is substantially similar to the example of FIG. 2A. In the example of FIG. 2B, cascade connection 226-2 is modified by removing switch 238. Thus, data output from cascade output 246 is provided to FIFO memory 248, and output to each different target DPE coupled to outputs 240 and 242. While the example of FIG. 2A illustrates two outputs, in other examples, more than two outputs may be included and output from FIFO memory 248. The example implementation of FIG. 2B may consume greater power than the example of FIG. 2A in that when data is provided over cascade output 246, the data is provided over each outputs concurrently without the ability to turn off particular outputs. Still, cascade output 246 may be turned on or off as previously discussed.

In the examples of FIGS. 2A and 2B, the cascade interfaces were shown to include two inputs and two outputs. As noted, the number of inputs and outputs of the cascade interfaces may be more than two, e.g., three as illustrated in the example of FIG. 5C. In such example implementations, the backpressure signals may be provided to each target and/or source DPE coupled to a cascade connection as described.

Figure 3A:
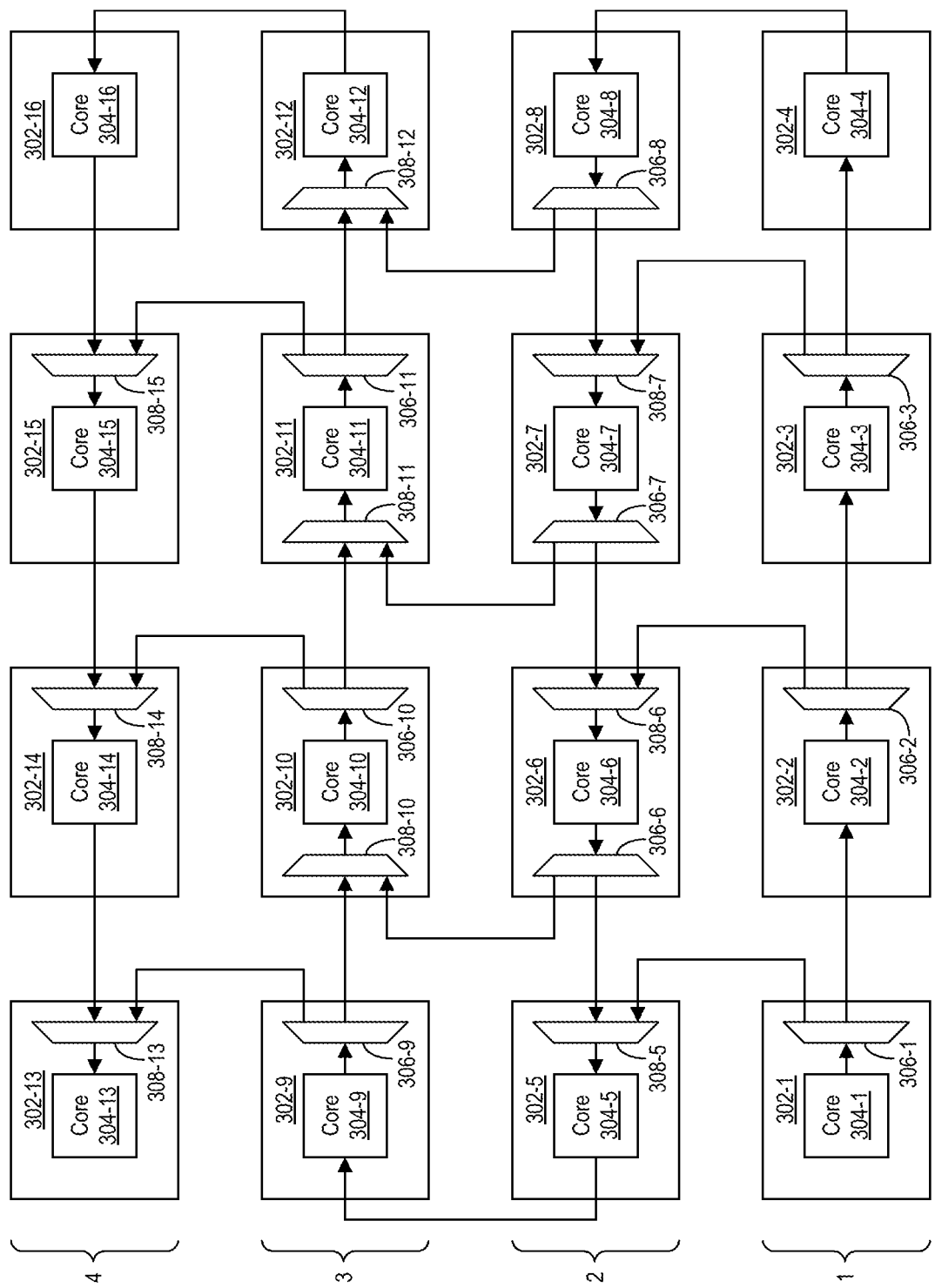
FIGS. 3A and 3B illustrate example connectivity of cores of a DPE array using cascade connections.
Figure 3B:
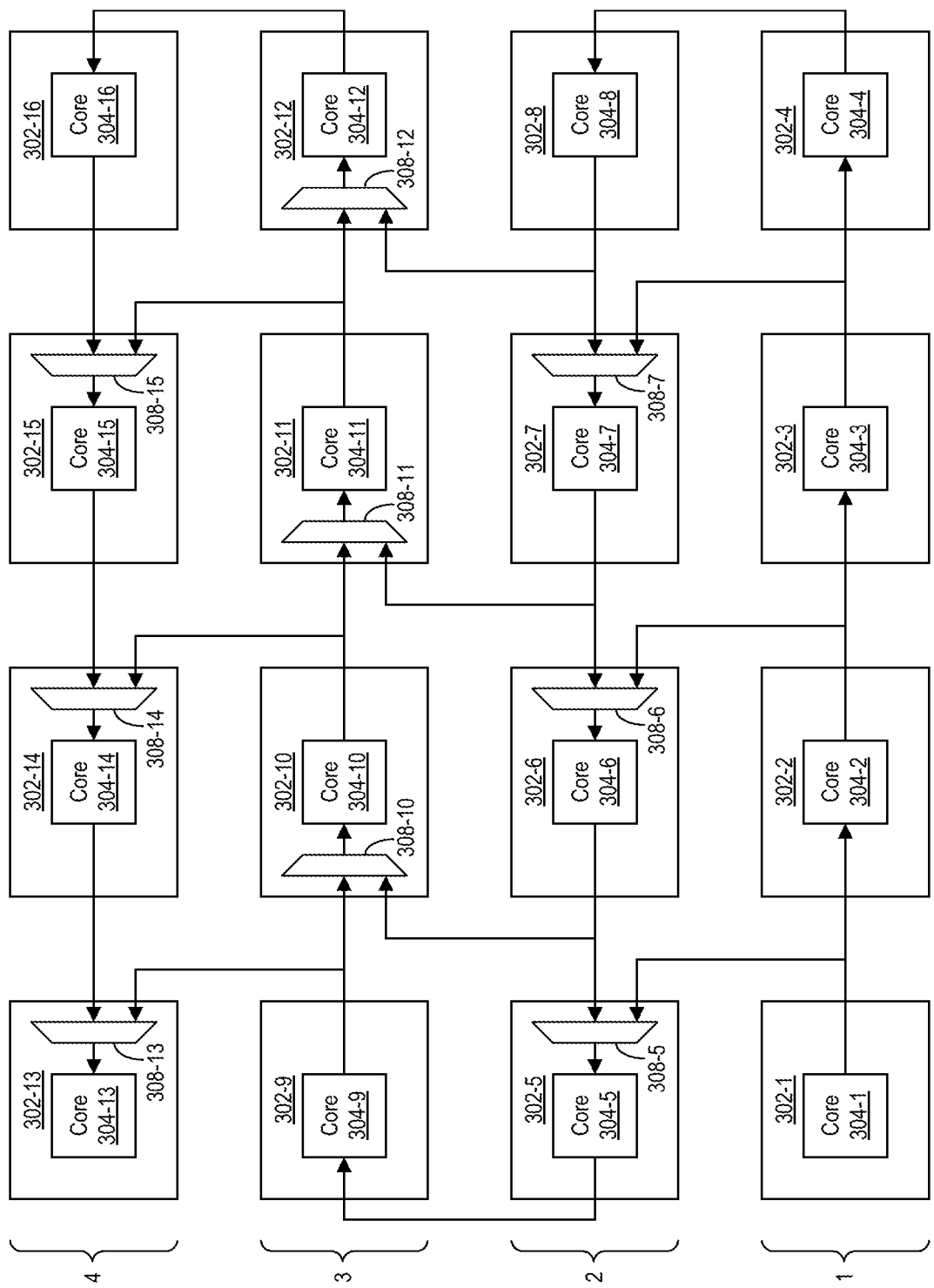

FIGS. 3A and 3B illustrate example connectivity of cores of a DPE array using cascade connections. In the example of FIG. 3A, DPE array 300 includes a plurality of DPEs 302 organized in a grid. Each DPE 302 includes a core 304. For purposes of clarity and illustration, particular elements DPEs and of DPE array 300 have been omitted. For example, the memory modules of DPEs 302 are omitted as are the various core interfaces (e.g., to memory modules), memory mapped switches, and stream switches. With regard to the cascade connections, FIFO memories are omitted.

As pictured, cores 304 are serially connected by way of the cascade inputs, outputs, and connections. Selected ones of cores 304 are capable of receiving data via an input cascade connection from a selected source core of two different source cores. Similarly, selected ones of cores 304 are capable of directing data via an output cascade connection to a selected target core of two different target cores.

Within FIG. 3A, those DPEs that lack a cascade connection, whether input or output, may include such a connection that may be preconfigured (e.g., not programmable) so as to connect to the only available source core, to the only available target core, or to no core as the case may be. Alternatively, the cascade connections may be omitted using directly connected cascade inputs and cascade outputs of the cores. Further, while one or more cores 304 may not be connected to a source core or a target core, such cores still may include cascade inputs, cascade outputs, input cascade connections, and/or output cascade connections as the case may be albeit in a disabled state (e.g., not programmable and permanently disabled).

In the following description, connections are described as occurring between cascade inputs and cascade outputs. It should be appreciated that such connections may be implemented by way of intervening cascade connections. Such connections are considered direct connections in that data propagates from core-to-core directly and not through intervening stream switches (e.g., as packetized data) and/or DMAs.

Regarding row 1, core 304-1, being the start of the serially connected cores 304 of DPE array 300, is not connected to a source core. Core 304-1 has a cascade output that is connected to a cascade input of core 304-2 and to a cascade input of core 304-5. Core 304-2 has a cascade input that is connected to only the cascade output of core 304-1. Core 304-2 as a cascade output that is connected to a cascade input of core 304-3 and to a cascade input of core 304-6. The cascade input of core 304-3 is connected only to the cascade output of core 304-2. Core 304-3 has a cascade output that is connected to a cascade input of core 304-4 and a cascade input of core 304-7. The cascade input of core 304-4 is connected only to the cascade output of core 304-3. Core 304-4 has a cascade output that is connected to only a cascade input of core 304-8.

Regarding row 2, the cascade input of core 304-8 is connected to only the cascade output of core 304-4. Core 304-8 has a cascade output that is connected to a cascade input of core 304-7 and a cascade input of core 304-12. The cascade input of core 304-7 is connected to the cascade output of core 304-3 and to the cascade output of core 304-8. Core 304-7 has a cascade output that is connected to a cascade input of core 304-6 and a cascade input of core 304-11. The cascade input of core 304-6 is connected to the cascade output of core 304-2 and to the cascade output of core 304-7. Core 304-6 has a cascade output that is connected to a cascade input of core 304-5 and a cascade input of core 304-10. The cascade input of core 304-5 is connected to the cascade output of core 304-1 and to the cascade output of core 304-6. Core 304-5 has a cascade output that is connected only to a cascade input of core 304-9.

Regarding row 3, the cascade input of core 304-9 is connected to only the cascade output of core 304-5. Core 304-9 has a cascade output that is connected to a cascade input of core 304-10 and a cascade input of core 304-13. The cascade input of core 304-10 is connected to the cascade output of core 304-6 and to the cascade output of core 304-9. Core 304-10 has a cascade output that is connected to a cascade input of core 304-11 and a cascade input of core 304-14. The cascade input of core 304-11 is connected to the cascade output of core 304-7 and to the cascade output of core 304-10. Core 304-11 has a cascade output that is connected to a cascade input of core 304-12 and to a cascade input of core 304-15. The cascade input of core 304-12 is connected to the cascade output of core 304-8 and the cascade output of core 304-11. Core 304-12 has a cascade output that is connected only to a cascade input of core 304-16.

Regarding row 4, the cascade input of core 304-16 is connected to only the cascade output of core 304-12. Core 304-16 has a cascade output that is only connected to a cascade input of core 304-15. The cascade input of core 304-15 is connected to the cascade output of core 304-16 and to the cascade output of core 304-11. Core 304-15 has a cascade output that is only connected to a cascade input of core 304-14. The cascade input of core 304-14 is connected to the cascade output of core 304-10 and to the cascade output of core 304-15. Core 304-14 has a cascade output that is only connected to a cascade input of core 304-13. The cascade input of core 304-13 is connected to the cascade output of core 304-9 and the cascade output of core 304-14.

For those DPEs 302 having a cascade output connected to two different target cores 304, the switch 306 of the output cascade connection is programmable to direct the data output from the cascade output of the source core to a selected one of the two target cores 304 (e.g., thereby isolating the non-selected output or outputs), to both target cores 304, or to no target cores (thereby deactivating switch 306 entirely). For those DPEs 302 having a cascade input connected to two (or more) different source cores 304, the switch 306 of the input cascade connection is programmable to receive the data output from a selected one of the source cores 304. The switch 306 may also be configured to isolate the non-selected input or may be deactivated entirely.

For purposes of illustration, consider DPE 302-6. The output cascade connection of DPE 302-6, e.g., switch 306-6, is configurable so that the data output from the cascade output of core 304-6 may be provided to core 304-5 of DPE 302-5, to core 304-10 of DPE 302-10, to both, or to no other core. The input cascade connection of DPE 302-6, e.g., switch 308-6, is configurable to receive data output from the cascade output of core 304-7 of DPE 302-7, from the cascade output of core 304-2 of DPE 302-2, or to receive no data from another core.

As discussed, cascade inputs and/or cascade outputs may be disabled. The switches 306 and 308 may also be disabled. This allows particular cores 304 to be connected by way of cascade connections as a cluster while also providing isolation between cores that are part of different clusters.

FIG. 3B illustrates an example implementation similar to that of FIG. 3A, but using the DPE architecture of FIG. 2B where switch 238 is omitted from each cascade output 226-2. The example of FIG. 3B leverages switches 308 to select the particular source core, if any, from which data is to be received by way of the cascade connections. As discussed, cascade outputs of cores still may be enabled or disabled independently despite the lack of a switch.

Figure 4:
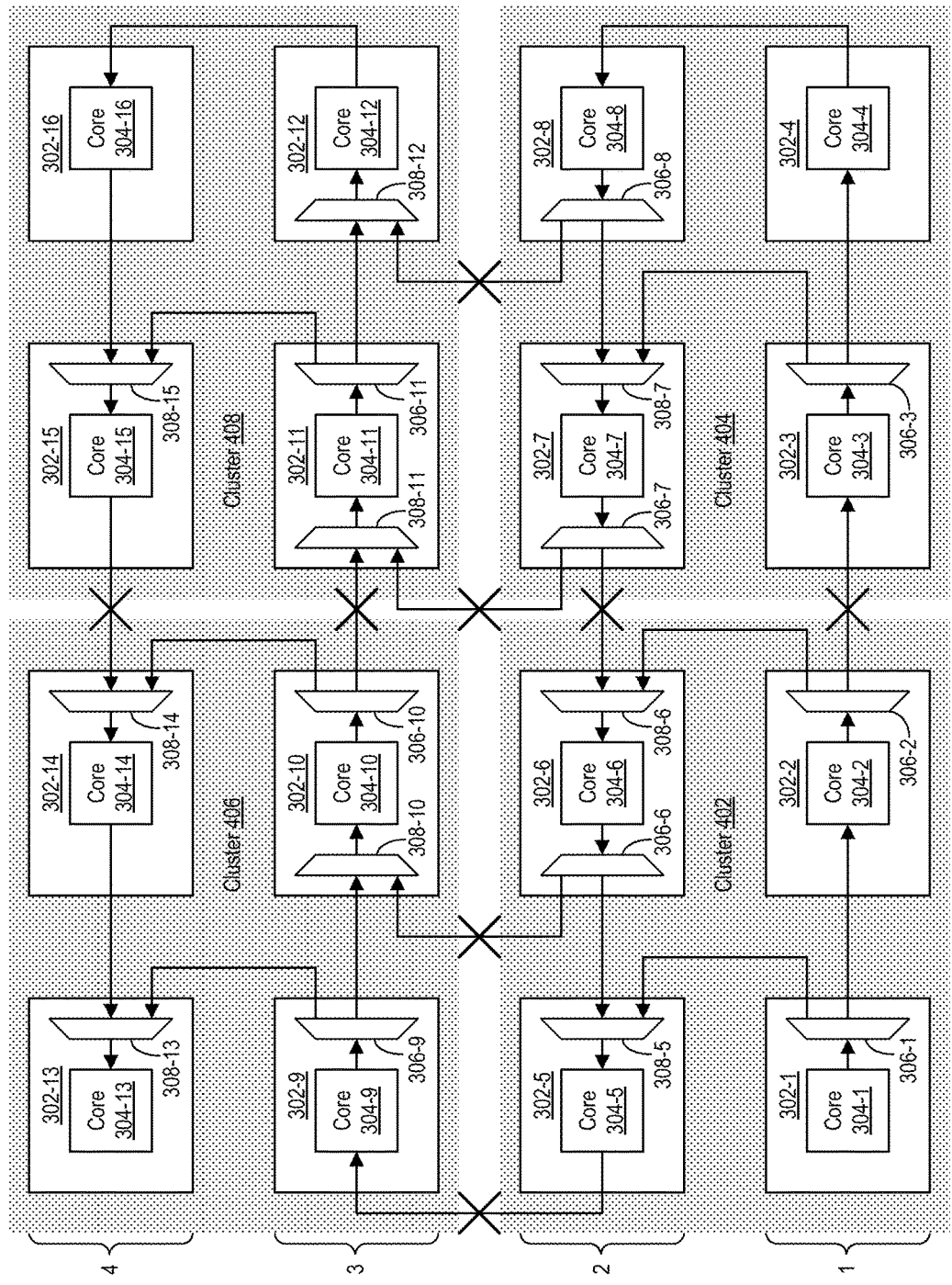
FIG. 4 illustrates an example formation of clusters in a DPE array.

FIG. 4 illustrates an example formation of clusters in DPE array 300. For purposes of illustration, the DPE array 300 corresponds to the example of FIG. 3A. In the example of FIG. 4, DPEs 302 are organized into clusters 402, 404, 406, and 408. The X's placed over cascade connections among cores and/or DPEs illustrates cascade connections that are disabled thereby isolating such cores at least with regard to the cascade connections. As discussed, isolation may also be achieved by restricting access of cores to memory modules and/or by restricting which DPEs are capable of communicating by way of the stream switches. Each of these channels of communication may be independently enabled/disabled among DPEs individually.

For example, while cores 304-1, 304-2, 304-6, and 304-7 are capable of communicating via the cascade connections, core 304-2 is unable to communicate directly with core 304-3 by way of the cascade connection. Similarly, core 304-5 is unable to communicate directly with core 304-9 by way of the cascade connection. Core 304-7 is unable to communicate with core 304-6 by way of the cascade connection; and core 304-6 is unable to communicate directly with core 304-10 by way of the cascade connection. Thus, while the cores in the same cluster (e.g., cluster 402) may be serially connected by way of the cascade connections and communicate over such cascade connections, the cores are unable to directly communicate by way of cascade connections with cores outside of that cluster (e.g., cores of cluster 402 may not communicate directly with another core outside of cluster 402 by way of cascade connections).

The particular size and shape of the clusters shown in FIG. 4 is for purposes of illustration and not intended as a limitation. A cluster may include two or more DPEs. Further, the connectivity of the stream switches and activation of core interfaces and memory interfaces may be controlled independently of the cascade interfaces and/or connections. By configuring the stream switches, core interfaces, and memory interfaces, isolation among clusters may also be achieved. For example, a core of a particular cluster may be prevented from reading a memory module of another DPE belonging to a different cluster. Similarly, a DPE may not be permitted to communicate with a DPE of another cluster by way of the stream switches.

Each different cluster of DPEs 302 is capable of communicating with other portions and/or circuit blocks of IC 100 via SoC interface block 122. As such, the memory mapped switches and stream switches may be configured to provide isolation among clusters while allowing the DPEs of the clusters (or selected DPEs of the clusters) to send and/or receive data via the appropriate tile of SoC interface block 122.

It should be appreciated that the clustering illustrated in FIG. 4 may be also be achieved using the example architecture corresponding to FIG. 3B. In the case of the example of FIG. 3B, the input switches 308 are used to determine the particular source DPE, if any, from which data is received over a cascade connection. In addition, particular cascade outputs may be disabled entirely.

Figure 5A:
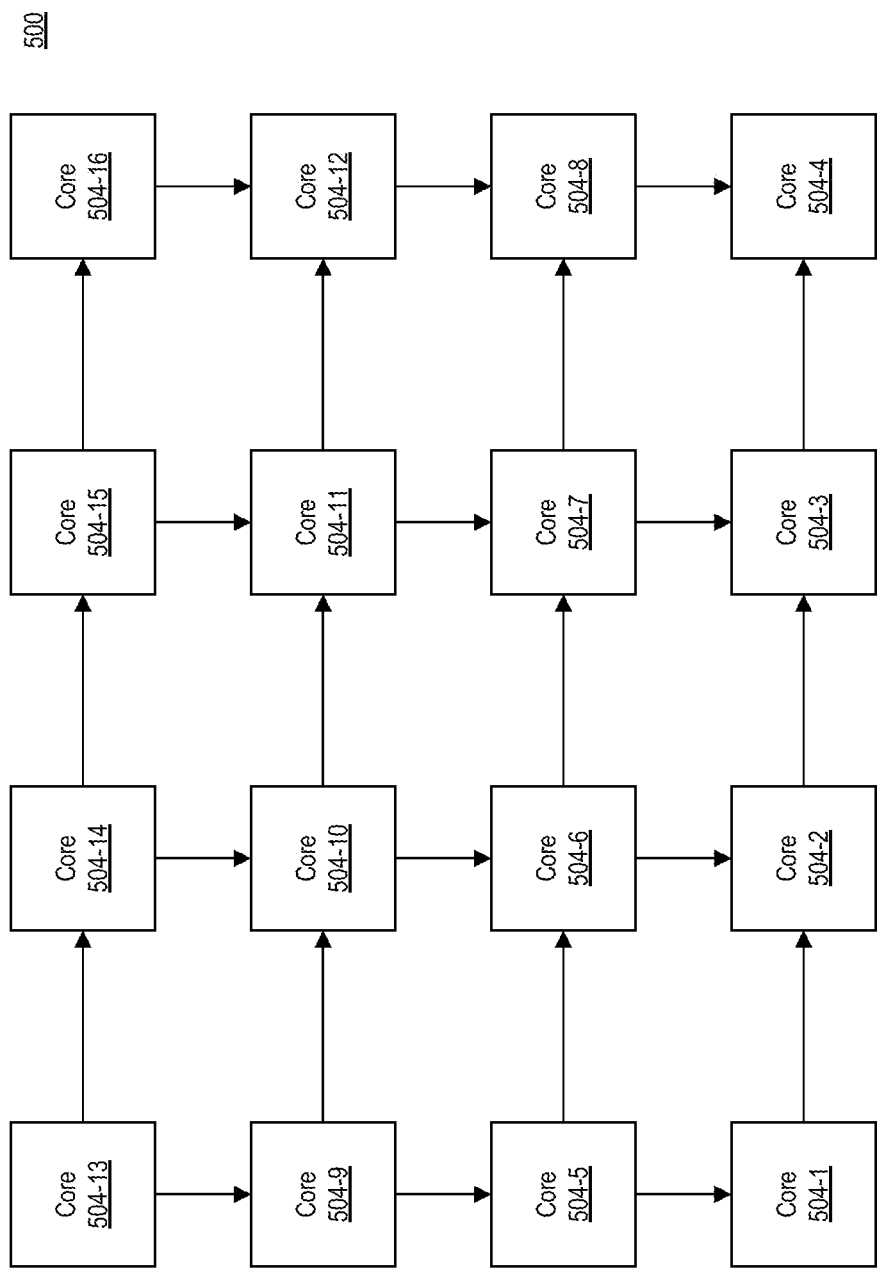
FIGS. 5A, 5B, and 5C illustrate further examples of connectivity of cores of a DPE array using cascade connections.
Figure 5B:
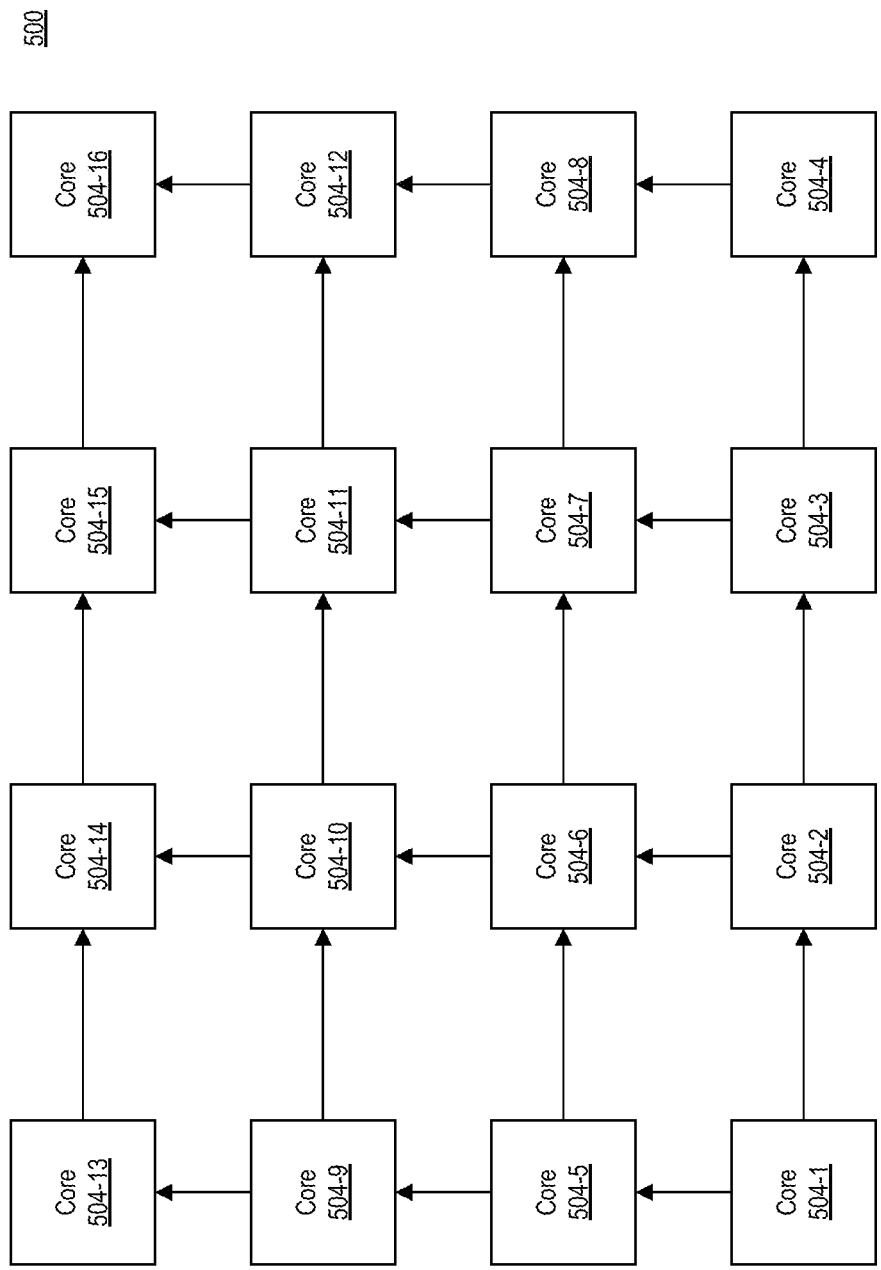
Figure 5C:
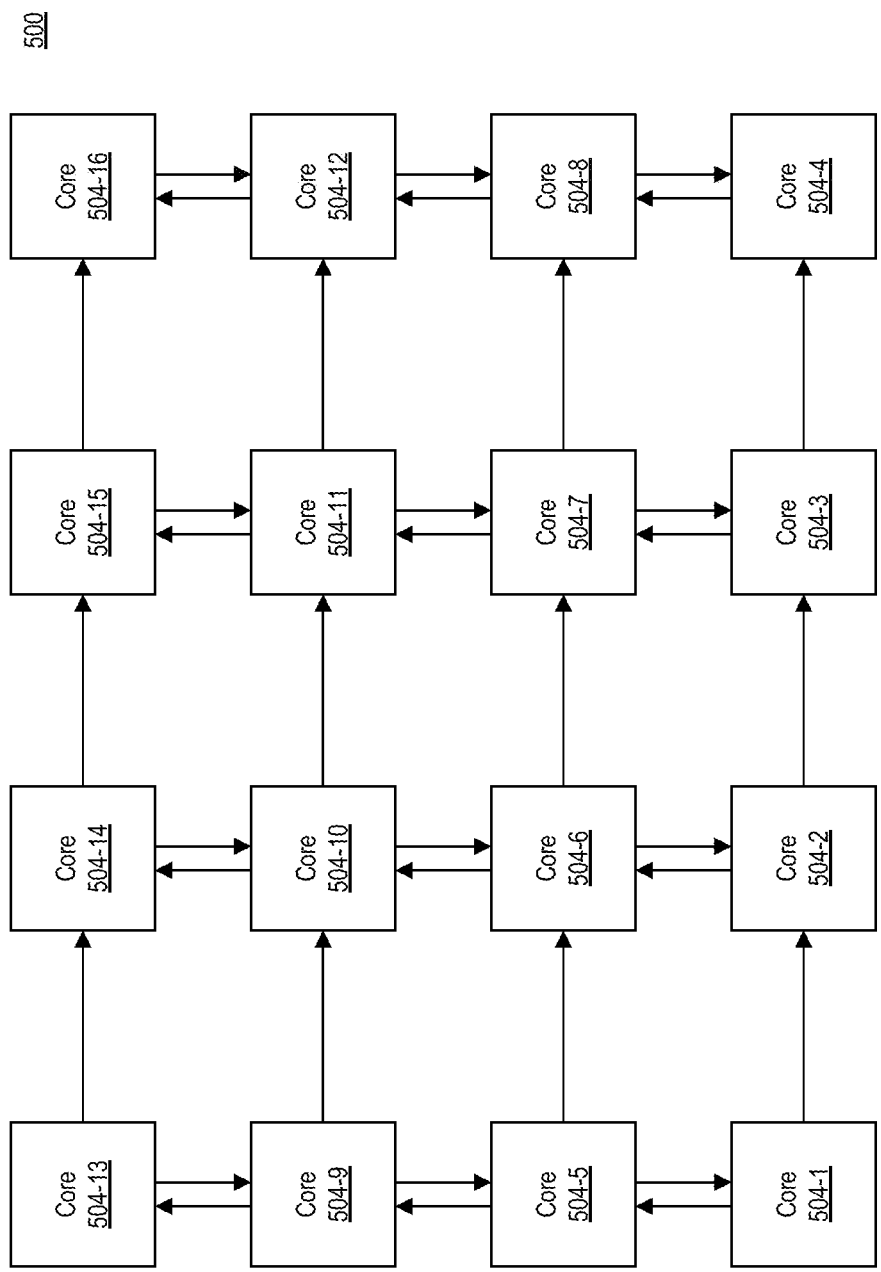

FIGS. 5A, 5B, and 5C illustrate further examples of connectivity of cores of a DPE array using cascade connections. Within architecture 500 shown in each of FIGS. 5A, 5B, and 5C, for purposes of illustration, only cores 504 are shown. It should be appreciated that the DPEs may be implemented using the architecture illustrated in FIG. 2A or the architecture illustrated in FIG. 2B.

In each of FIGS. 5A, 5B, and 5C, cores 504 have cascade connections that move from left to right as opposed to moving back and forth from one row to another. Further, different rows of cores 504 are not connected. That is, the cascade connections do not "wrap around" from a core in one row to a core in another row.

In the example of FIG. 5A, the additional cascade connections flow from top to bottom. As noted, in other example implementations, cores 504 may be implemented with cascade connections that flow from right to left. In the example of FIG. 5B, the additional cascade connections flow from bottom to top. As noted, in other example implementations, cores 504 may be implemented with cascade connections that flow from right to left.

The example of FIG. 5C includes cascade connections that flow from left to right, cascade connections that flow from top to bottom, and cascade connections that flow from bottom to top. FIG. 5C illustrates an example of architecture 500 where cascade connections for selected ones of DPEs 504 are capable of receiving up to three inputs and/or generating up to three outputs. As noted, in other example implementations, cores 504 may be implemented with cascade connections that flow from right to left.

Figure 6:
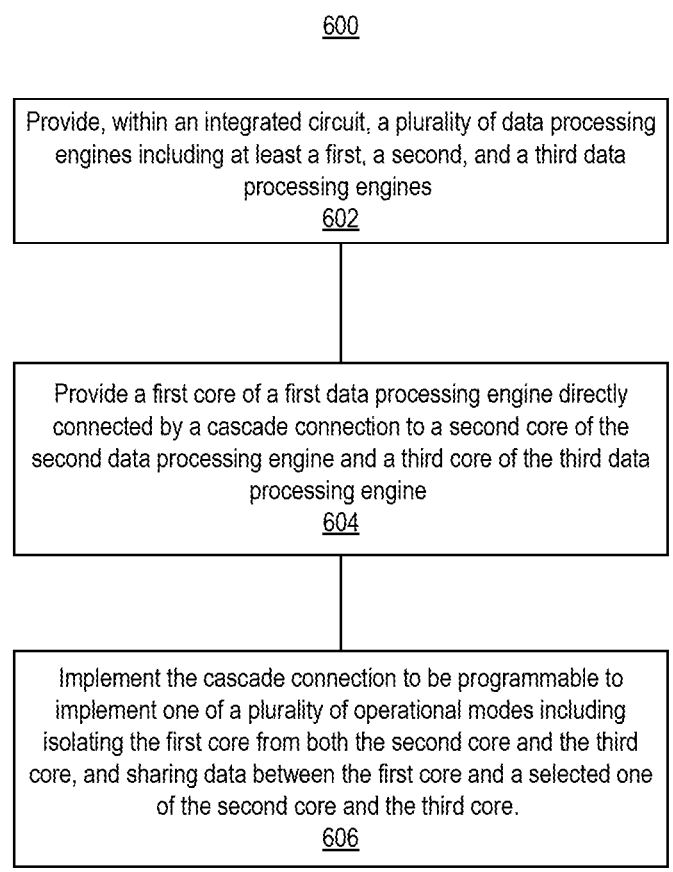
FIG. 6 illustrates an example method of implementing a plurality of DPEs having cascade connections among the cores.

FIG. 6 illustrates an example method 600 of implementing a plurality of DPEs having cascade connections among the cores. In block 602, a plurality of DPEs are provided within an IC. The plurality of DPEs can include at least a first, a second, and a third DPEs. The DPE array may include only cores configured to execute instructions, may include only cores implemented using dedicated circuitry that do not execute instructions, or may include a combination of both types of cores in the DPE array. In block 604, a first core of the first DPE can be provided. The first core is directly connected by a cascade connection to a second core of the second DPE and a third core of the third DPE. In block 606, the cascade connection is implemented to be programmable to implement one of a plurality of operational modes including isolating the first core from at least one of the second core or the third core, and sharing data between the first core and a selected one of the second core and the third core.

Figure 7:
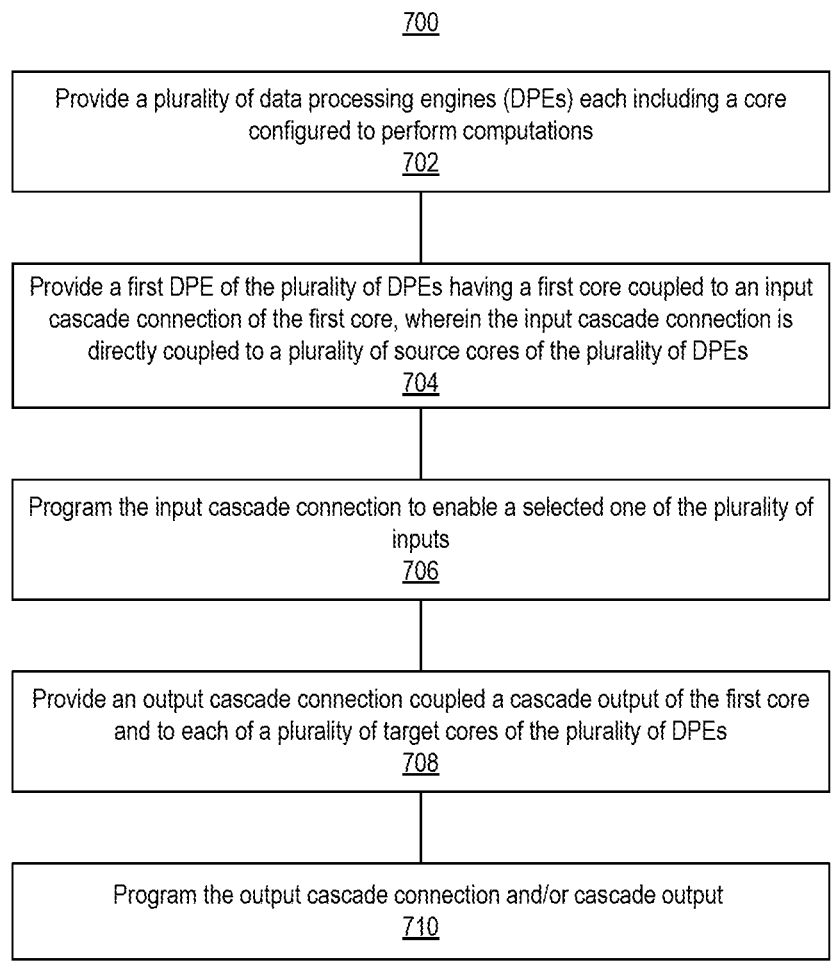
FIG. 7 illustrates another example method of implementing a plurality of DPEs having cascade connections among the cores.

FIG. 7 illustrates an example method 700 of implementing a plurality of DPEs having cascade connections among the cores. In block 702, a plurality of DPEs are provided. Each of the DPEs may include a core configured to perform computations. The DPE array may include only cores configured to execute instructions, may include only cores implemented using dedicated circuitry that do not execute instructions, or may include a combination of both types of cores in the DPE array. In block 704, a first DPE of the plurality of DPEs is provided. The first DPE has a first core and an input cascade connection coupled to the first core. The input cascade connection is directly coupled to a plurality of source cores of the plurality of DPEs. The input cascade connection includes a plurality of inputs, wherein each of the plurality of inputs is connected to a cascade output of a different one of the plurality of source cores.

In block 706, the input cascade connection is programmed to enable a selected one of the plurality of inputs. For example, the method may include, in response to programming the input cascade connection to enable a selected one of the plurality of inputs, receiving data via the selected one of the plurality of inputs from a selected source core of the plurality of source cores. As discussed, the input cascade connection may also be programmed to disable each input.

In block 708, an output cascade connection may be provided. The output cascade connection may be coupled to a cascade output of the first core and to each of a plurality of target cores of the plurality of DPEs. The output cascade connection includes a plurality of outputs, wherein each of the plurality of outputs is connected to a cascade input of a different one of the plurality of target cores.

In block 710, the output cascade connection or the cascade output of the first DPE may be programmed. For example, data may be sent from the output cascade connection to each of the plurality of target cores concurrently. In another example, the output cascade connection is programmed to enable selected ones of the plurality of outputs and concurrently send data from each of the plurality of outputs of the output cascade connection that is enabled. In another example, data may be sent from an internal register of the first core, via one or more of the outputs of the output cascade connection, to an internal register of each selected target core of the plurality of target cores. Still, as discussed, the cascade output and/or output cascade connection may be disabled entirely.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon,"

means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

The flowchart and block diagrams in the Figures illustrate the architecture, functionality, and operation of possible implementations of systems and methods according to various aspects of the inventive arrangements. In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one or more example implementations, an IC includes a plurality of DPEs each including a core configured to execute instructions. A first DPE of the plurality of DPEs includes a first core coupled to an input cascade connection of the first core. The input cascade connection is directly coupled to a plurality of source cores of the plurality of DPEs. The input cascade connection includes a plurality of inputs, wherein each of the plurality of inputs is connected to a cascade output of a different one of the plurality of source cores. The input cascade connection is programmable to enable a selected one of the plurality of inputs.

The foregoing and other implementations can each optionally include one or more of the following features, alone or in combination. Some example implementations include all the following features in combination.

In another aspect, the input cascade connection is programmable to disable each of the plurality of inputs.

In another aspect, the first core receives data, via the selected one of the plurality of inputs, from a selected source core of the plurality of source cores.

In another aspect, the input cascade connection includes a switch coupled to a cascade input of the first core and the cascade output of each core of the plurality of source cores.

In another aspect, the input cascade connection includes a FIFO memory having an input coupled to an output of the switch and an output coupled to the cascade input of the first core.

In another aspect, the cascade input is coupled to an internal register of the first core.

In another aspect, the internal register of the first core is coupled to a cascade output of the first core.

In another aspect, the first DPE includes an output cascade connection coupled a cascade output of the first core and to each of a plurality of target cores of the plurality of DPEs. The output cascade connection includes a plurality of outputs, wherein each of the plurality of outputs is connected to a cascade input of a different one of the plurality of target cores.

In another aspect, the output cascade connection is configured to send data to each of the plurality of target cores concurrently.

In another aspect, the output cascade connection is programmable to enable selected ones of the plurality of outputs.

In another aspect, the output cascade connection includes a switch coupled to the cascade output of the first core and the cascade input of each core of the plurality of target cores.

In another aspect, the output cascade connection includes a FIFO memory having an input coupled to the cascade output of the first core and an output coupled to an input of the switch.

In another aspect, an internal register of the first core is coupled to the cascade output of the first core.

In another aspect, the first core sends data from the internal register of the first core, via one or more of the outputs of the output cascade connection, to an internal register of each selected target core of the plurality of target cores.

In one or more example implementations, a method includes providing a plurality of DPEs each including a core configured to execute instructions and providing a first DPE of the plurality of DPEs having a first core coupled to an input cascade connection of the first core. The input cascade connection is directly coupled to a plurality of source cores of the plurality of DPEs. The input cascade connection includes a plurality of inputs, wherein each of the plurality of inputs is connected to a cascade output of a different one of the plurality of source cores. The method can include programming the input cascade connection to enable a selected one of the plurality of inputs.

The foregoing and other implementations can each optionally include one or more of the following features, alone or in combination. Some example implementations include all the following features in combination.

In another aspect, the method includes, in response to programming the input cascade connection to enable a selected one of the plurality of inputs, receiving data via the selected one of the plurality of inputs from a selected source core of the plurality of source cores.

In another aspect, the method includes, providing an output cascade connection coupled a cascade output of the first core and to each of a plurality of target cores of the plurality of DPEs. The output cascade connection includes a plurality of outputs, wherein each of the plurality of outputs is connected to a cascade input of a different one of the plurality of target cores.

In another aspect, the method includes, sending data from the output cascade connection to each of the plurality of target cores concurrently.

In another aspect, the method includes, programming the output cascade connection to enable selected ones of the plurality of outputs and concurrently sending data from each of the plurality of outputs of the output cascade connection that is enabled.

In another aspect, the method includes, sending data from an internal register of the first core, via one or more of the outputs of the output cascade connection, to an internal register of each selected target core of the plurality of target cores.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. An integrated circuit, comprising:
   a plurality of data processing engines (DPEs) each including a core configured to perform computations;
   wherein a first DPE of the plurality of DPEs includes a first core coupled to an input cascade connection of the first core, wherein the input cascade connection is coupled to a plurality of source cores of the plurality of DPEs;
   wherein the input cascade connection includes a plurality of inputs, wherein each of the plurality of inputs is coupled to a cascade output of a different one of the plurality of source cores;
   wherein the input cascade connection is programmable to enable a selected one of the plurality of inputs;
   wherein the first DPE includes an output cascade connection coupled to a cascade output of the first core and to each of a plurality of target cores of the plurality of DPEs; and
   wherein the output cascade connection includes a plurality of outputs, wherein each of the plurality of outputs is coupled to a cascade input of a different one of the plurality of target cores.

2. The integrated circuit of claim 1, wherein the input cascade connection is programmable to disable each of the plurality of inputs.

3. The integrated circuit of claim 1, wherein the first core receives data, via the selected one of the plurality of inputs, from a selected source core of the plurality of source cores.

4. The integrated circuit of claim 1, wherein the input cascade connection comprises:
   a switch coupled to a cascade input of the first core and the cascade output of each core of the plurality of source cores.

5. The integrated circuit of claim 4, wherein the input cascade connection comprises:
   a first-in-first-out memory having an input coupled to an output of the switch and an output coupled to the cascade input of the first core.

6. The integrated circuit of claim 1, wherein a cascade input of the first core is coupled to an internal register of the first core.

7. The integrated circuit of claim 6, wherein the internal register of the first core is coupled to the cascade output of the first core.

8. The integrated circuit of claim 1,
   wherein the plurality of DPEs are configured to operate as a plurality clusters, wherein each cluster is functionally isolated from each other cluster and each cluster includes one or more of the plurality of DPEs.

9. The integrated circuit of claim 1, wherein the output cascade connection is configured to send data to each of the plurality of target cores concurrently.

10. The integrated circuit of claim 1, wherein the output cascade connection is programmable to enable selected ones of the plurality of outputs.

11. The integrated circuit of claim 10, wherein the output cascade connection comprises:
    a switch coupled to the cascade output of the first core and the cascade input of each core of the plurality of target cores.

12. The integrated circuit of claim 11, wherein the output cascade connection comprises:
    a first-in-first-out memory having an input coupled to the cascade output of the first core and an output coupled to an input of the switch.

13. The integrated circuit of claim 1, wherein an internal register of the first core is coupled to the cascade output of the first core.

14. The integrated circuit of claim 13, wherein the first core sends data from the internal register of the first core, via one or more of the outputs of the output cascade connection, to an internal register of each selected target core of the plurality of target cores.

15. A method, comprising:
    providing a plurality of data processing engines (DPEs) each including a core configured to perform computations;
    providing a first DPE of the plurality of DPEs having a first core coupled to an input cascade connection of the first core, wherein the input cascade connection is coupled to a plurality of source cores of the plurality of DPEs;
    wherein the input cascade connection includes a plurality of inputs, wherein each of the plurality of inputs is coupled to a cascade output of a different one of the plurality of source cores;
    programming the input cascade connection to enable a selected one of the plurality of inputs; and
    providing an output cascade connection coupled a cascade output of the first core and to each of a plurality of target cores of the plurality of DPEs;
    wherein the output cascade connection includes a plurality of outputs, wherein each of the plurality of outputs is connected to a cascade input of a different one of the plurality of target cores.

16. The method of claim 15, further comprising:

in response to programming the input cascade connection to enable a selected one of the plurality of inputs, receiving data via the selected one of the plurality of inputs from a selected source core of the plurality of source cores.

17. The method of claim 15, wherein the plurality of DPEs are configured to operate as a plurality clusters, wherein each cluster is functionally isolated from each other cluster and each cluster includes one or more of the plurality of DPEs.

18. The method of claim 15, further comprising:

sending data from the output cascade connection to each of the plurality of target cores concurrently.

19. The method of claim 15, further comprising:

programming the output cascade connection to enable selected ones of the plurality of outputs; and concurrently sending data from each of the plurality of outputs of the output cascade connection that is enabled.

20. The method of claim 15, further comprising:

sending data from an internal register of the first core, via one or more of the outputs of the output cascade connection, to an internal register of each selected target core of the plurality of target cores.

* * * * *

UNITED STATES PATENT AND TRADEMARK OFFICE
CERTIFICATE OF CORRECTION

| | | |
|---|---|---|
| PATENT NO. | : 11,443,091 B1 | Page 1 of 1 |
| APPLICATION NO. | : 16/945006 | |
| DATED | : September 13, 2022 | |
| INVENTOR(S) | : Peter McColgan et al. | |

It is certified that error appears in the above-identified patent and that said Letters Patent is hereby corrected as shown below:

On the Title Page

In Item (72) Inventors, "Stephan Munz," should read --Stephan Münz--.

Signed and Sealed this
Twenty-seventh Day of June, 2023

Katherine Kelly Vidal
*Director of the United States Patent and Trademark Office*